US012585855B2

(12) United States Patent
Kim et al.

(10) Patent No.: US 12,585,855 B2
(45) Date of Patent: Mar. 24, 2026

(54) METHOD OF DESIGNING LAYOUT OF SEMICONDUCTOR INTEGRATED CIRCUIT, METHOD OF DESIGNING AND MANUFACTURING SEMICONDUCTOR INTEGRATED CIRCUIT USING THE SAME, AND DESIGN SYSTEM PERFORMING SAME

(71) Applicant: SAMSUNG ELECTRONICS CO., LTD., Suwon-si (KR)

(72) Inventors: Jonghyeok Kim, Suwon-si (KR); Myungjin Choi, Suwon-si (KR); Yoongi Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 749 days.

(21) Appl. No.: 17/945,724

(22) Filed: Sep. 15, 2022

(65) Prior Publication Data
US 2023/0237236 A1     Jul. 27, 2023

(30) Foreign Application Priority Data
Jan. 26, 2022    (KR) ........................ 10-2022-0011299

(51) Int. Cl.
*G06F 30/392*        (2020.01)
*G06F 30/327*        (2020.01)
*G06F 30/394*        (2020.01)
(52) U.S. Cl.
CPC .......... *G06F 30/392* (2020.01); *G06F 30/327* (2020.01); *G06F 30/394* (2020.01)
(58) Field of Classification Search
USPC ........................................................ 716/100
See application file for complete search history.

(56) References Cited

U.S. PATENT DOCUMENTS 5,157,618 A * 10/1992 Ravindra ........... H03K 19/1735
716/119
6,226,775 B1     5/2001 Yamada
(Continued)

FOREIGN PATENT DOCUMENTS

EP          1 650 688 A1     4/2006
JP          11-67923 A       3/1999
(Continued)

OTHER PUBLICATIONS

Extended European Search Report dated Jun. 15, 2023, issued by European Patent Office in European Patent Application No. 22207895.8.

*Primary Examiner* — Mohammed Alam
(74) *Attorney, Agent, or Firm* — Sughrue Mion, PLLC

(57) ABSTRACT
A method of designing a layout of a semiconductor integrated circuit, including receiving input data defining the semiconductor integrated circuit; determining a first layout of the semiconductor integrated circuit by performing a placement and routing (P&R) procedure based on the input data, wherein the first layout includes a plurality of blocks, a plurality of standard cells, a plurality of power wirings, a plurality of ground wirings, a plurality of clock wirings, and a plurality of signal wirings; selecting a target region of the first layout, wherein the target region is capable of accommodating at least one additional power wiring and at least one additional ground wiring; and determining a second layout of the semiconductor integrated circuit by modifying the first layout to include the at least one additional power wiring and the at least one additional ground wiring in the target region.

20 Claims, 24 Drawing Sheets

(56)                    References Cited

U.S. PATENT DOCUMENTS

| | | | |
|---|---|---|---|
| 6,327,694 | B1 | 12/2001 | Kanazawa |
| 6,912,704 | B1 | 6/2005 | Teig |
| 7,263,681 | B2 | 8/2007 | Sonohara |
| 7,590,902 | B1 * | 9/2009 | Tabatabaei ..... G01R 31/318508 |
| | | | 714/724 |
| 8,010,929 | B2 | 8/2011 | Malhotra et al. |
| 8,566,776 | B2 | 10/2013 | Qiu |
| 8,839,177 | B1 * | 9/2014 | Aubel ................... G06F 30/392 |
| | | | 716/132 |
| 9,697,320 | B2 | 7/2017 | Gudala et al. |
| 10,331,838 | B2 | 6/2019 | Yang et al. |
| 2006/0085778 | A1 | 4/2006 | Keinert et al. |
| 2006/0175637 | A1 | 8/2006 | Lee |
| 2007/0136700 | A1 * | 6/2007 | Wang ..................... G06F 30/30 |
| | | | 716/112 |
| 2013/0249014 | A1 * | 9/2013 | Kito ....................... H10D 89/10 |
| | | | 716/112 |
| 2017/0061063 | A1 | 3/2017 | Gupta et al. |
| 2023/0237236 | A1 * | 7/2023 | Kim ..................... G06F 30/392 |
| | | | 716/100 |

FOREIGN PATENT DOCUMENTS

| | | | | |
|---|---|---|---|---|
| JP | 2004-47516 | A | 2/2004 | |
| JP | 2010-161153 | A | 7/2010 | |
| JP | 2013201159 | A * | 10/2013 | ........... G06F 30/398 |

* cited by examiner

:STANDARD CELL

GENERATING STANDARD CELL

SC    IUT

TP

CH

CW

PERFORMING FLOORPLAN

SR    MRT

TGS

TP

RH

RW

ORP

D1    D2

S300

START

SET TARGET REGION ON PARTIAL REGION OF
SEMICONDUCTOR INTEGRATED CIRCUIT    —S310

END

S310

START

SET REGION ADJACENT TO CORNER OR EDGE OF
SEMICONDUCTOR INTEGRATED CIRCUIT
AS TARGET REGION    —S312

END

F I G.  14A
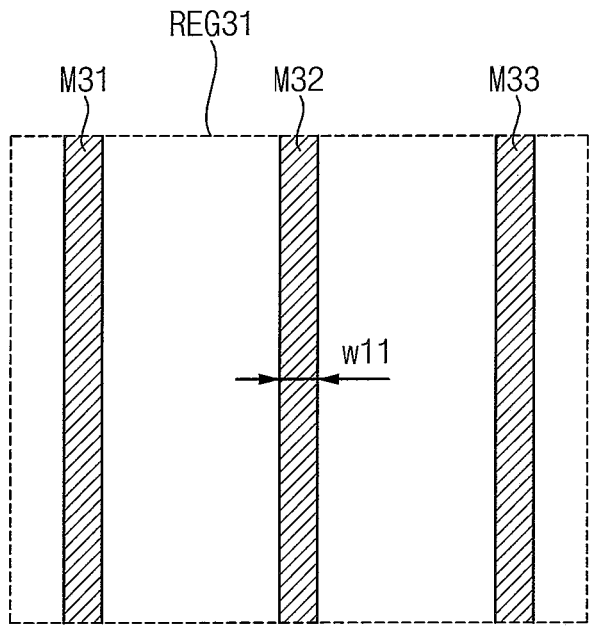
F I G.  14B
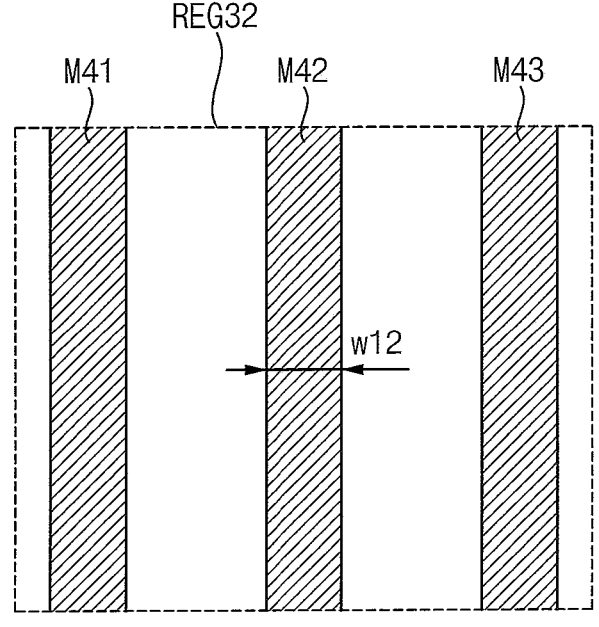

S300

START

SET TARGET REGION ON PARTIAL SUB-REGION OF BLOCK
INCLUDED IN SEMICONDUCTOR INTEGRATED CIRCUIT          S330

END

S330

START

SET SUB-REGION ADJACENT TO CORNER OR EDGE
OF BLOCK AS TARGET REGION          S332

END

START

↓

ARRANGE AT LEAST ONE ADDITIONAL POWER WIRING AND AT LEAST ONE ADDITIONAL GROUND WIRING IN WHITE SPACE INCLUDED IN TARGET REGION —S410

↓

ELECTRICALLY CONNECT AT LEAST ONE ADDITIONAL POWER WIRING AND AT LEAST ONE ADDITIONAL GROUND WIRING WITH A PLURALITY OF POWER WIRINGS AND A PLURALITY OF GROUND WIRINGS —S420

↓

END

WS

MP11 MP21 MG1     MP12 MP22 MG2

BLKA

2400

2500

METHOD OF DESIGNING LAYOUT OF SEMICONDUCTOR INTEGRATED CIRCUIT, METHOD OF DESIGNING AND MANUFACTURING SEMICONDUCTOR INTEGRATED CIRCUIT USING THE SAME, AND DESIGN SYSTEM PERFORMING SAME

CROSS-REFERENCE TO RELATED APPLICATION

This application is based on and claims priority under 35 USC § 119 to Korean Patent Application No. 10-2022-0011299 filed on Jan. 26, 2022 in the Korean Intellectual Property Office, the disclosure of which is incorporated by reference herein in its entirety.

BACKGROUND

1. Field

Example embodiments relate generally to semiconductor integrated circuits, and more particularly to methods of designing layouts of semiconductor integrated circuits, methods of designing semiconductor integrated circuits, methods of manufacturing semiconductor integrated circuits, and design systems.

2. Description of Related Art

A semiconductor integrated circuit may be manufactured by patterning devices and mutual connections thereof on a substrate such as a semiconductor wafer. A semiconductor integrated circuit may be manufactured through a process in which a designer designs an integrated circuit using an electronic design automation (EDA) tool, which enables various circuit components to be placed to interact with each other and to be connected to each other. In other words, a layout designer may generate a layout and physical design of a semiconductor integrated circuit using the EDA tool.

The layout and physical design of the semiconductor integrated circuit may include physical locations and sizes of circuit components, connection wires and various layers. As the degree of integration of semiconductor integrated circuits increases, various methods of robustly and efficiently designing semiconductor integrated circuits have been researched.

SUMMARY

Provided is a method of designing a layout of a semiconductor integrated circuit capable of efficiently utilizing white spaces.

Also provided is a method of designing a semiconductor integrated circuit and a method of manufacturing a semiconductor integrated circuit that use the method of designing the layout of the semiconductor integrated circuit.

Also provided is a design system that performs the method of designing the layout of the semiconductor integrated circuit and/or the method of designing the semiconductor integrated circuit.

Additional aspects will be set forth in part in the description which follows and, in part, will be apparent from the description, or may be learned by practice of the presented embodiments.

In accordance with an aspect of the disclosure, a method of designing a layout of a semiconductor integrated circuit includes receiving input data defining the semiconductor integrated circuit; determining a first layout of the semiconductor integrated circuit by performing a placement and routing (P&R) procedure based on the input data, wherein the first layout includes a plurality of blocks, a plurality of standard cells, a plurality of power wirings, a plurality of ground wirings, a plurality of clock wirings, and a plurality of signal wirings; selecting a target region of the first layout, wherein the target region is capable of accommodating at least one additional power wiring and at least one additional ground wiring; and determining a second layout of the semiconductor integrated circuit by modifying the first layout to include the at least one additional power wiring and the at least one additional ground wiring in the target region.

In accordance with an aspect of the disclosure, a design system for a semiconductor integrated circuit includes a storage device configured to store information including instructions; and a processor configured to access the storage device and to execute the instructions to implement a design module configured to: receive input data defining the semiconductor integrated circuit; determine a first layout of the semiconductor integrated circuit by performing a placement and routing (P&R) process based on the input data, wherein the first layout includes a plurality of blocks, a plurality of standard cells, a plurality of power wirings, a plurality of ground wirings, a plurality of clock wirings, and a plurality of signal wirings; select a target region of the first layout, wherein the target region is capable of accommodating at least one additional power wiring and at least one additional ground wiring; and determine a second layout of the semiconductor integrated circuit by modifying the first layout to include the at least one additional power wiring and the at least one additional ground wiring in the target region.

In accordance with an aspect of the disclosure, a method of designing a semiconductor integrated circuit includes performing a behavior level design of the semiconductor integrated circuit; performing a register transfer level (RTL) design of the semiconductor integrated circuit; performing a gate level design of the semiconductor integrated circuit; and performing a layout level design of the semiconductor integrated circuit, wherein performing the layout level design includes: receiving input data defining the semiconductor integrated circuit; determining a first layout of the semiconductor integrated circuit by performing a placement and routing (P&R) procedure based on the input data, the first layout including a plurality of blocks, a plurality of standard cells, a plurality of power wirings, a plurality of ground wirings, a plurality of clock wirings, and a plurality of signal wirings; selecting a target region of the first layout, wherein the target region is capable of accommodating at least one additional power wiring and at least one additional ground wiring; and determining a second layout of the semiconductor integrated circuit by modifying the first layout to include the at least one additional power wiring and the at least one additional ground wiring in the target region.

In accordance with an aspect of the disclosure, a method of designing a layout of a semiconductor integrated circuit includes receiving input data defining the semiconductor integrated circuit; determining a first layout of the semiconductor integrated circuit by performing a placement and routing (P&R) procedure based on the input data, wherein obtaining the first layout includes: performing a floor plan of a plurality of blocks and a plurality of standard cells that are included in the semiconductor integrated circuit; performing a power plan of a plurality of power wirings and a plurality of ground wirings that are included in the semiconductor integrated circuit; performing a placement of elements that are included in the plurality of blocks and the plurality of standard cells; performing a clock tree synthesis (CTS) of clock signals that are provided to the elements via a plurality of clock wirings included in the semiconductor integrated circuit; and performing a routing of general signals that are provided to the elements via a plurality of signal wirings included in the semiconductor integrated circuit; verifying a result of the placement and the routing; while the verifying is performed, selecting a target region of the first layout, wherein the target region is capable of accommodating at least one additional power wiring and at least one additional ground wiring; and determining a second layout of the semiconductor integrated circuit by modifying the first layout to include the at least one additional power wiring and the at least one additional ground wiring in the target region, wherein the target region includes at least one of a first region included in the semiconductor integrated circuit and a first sub-region included in a first block from among the plurality of blocks included in the semiconductor integrated circuit, the first region being adjacent to a corner or an edge of the semiconductor integrated circuit, and the first sub-region being adjacent to a corner or an edge of the first block, and wherein the plurality of power wirings and the plurality of ground wirings are formed in a plurality of wiring layers which are stacked in a vertical direction, wherein the at least one additional power wiring and the at least one additional ground wiring are formed in a first wiring layer among the plurality of wiring layers, and wherein the at least one additional power wiring and the at least one additional ground wiring are not formed in a second wiring layer among the plurality of wiring layers.

In accordance with an aspect of the disclosure, a method of manufacturing a semiconductor integrated circuit includes designing the semiconductor integrated circuit; and fabricating the semiconductor integrated circuit based on a result of the designing of the semiconductor integrated circuit, wherein the designing of the semiconductor integrated circuit includes: performing a behavior level design of the semiconductor integrated circuit; performing a register transfer level (RTL) design of the semiconductor integrated circuit; performing a gate level design of the semiconductor integrated circuit; and performing a layout level design of the semiconductor integrated circuit, and wherein performing the layout level design includes: receiving input data defining the semiconductor integrated circuit; determining a first layout of the semiconductor integrated circuit by performing a placement and routing (P&R) procedure based on the input data, wherein the first layout includes a plurality of blocks, a plurality of standard cells, a plurality of power wirings, a plurality of ground wirings, a plurality of clock wirings, and a plurality of signal wirings; selecting a target region on the first layout, wherein the target region is capable of accommodating at least one additional power wiring and at least one additional ground wiring; and determining a second layout of the semiconductor integrated circuit by modifying the first layout to include the at least one additional power wiring and the at least one additional ground wiring in the target region.

In accordance with an aspect of the disclosure, a device for designing a layout of a semiconductor integrated circuit includes a receiver configured to receive a first bitstream, wherein the first bitstream is generated by synthesizing the semiconductor integrated circuit based on a hardware description language; and at least one processor configured to: determine a first layout of the semiconductor integrated circuit by performing a placement and routing (P&R) procedure based on the first bitstream, wherein the first layout includes a plurality of blocks, a plurality of standard cells, a plurality of power wirings, a plurality of ground wirings, a plurality of clock wirings, and a plurality of signal wirings; select a target region of the first layout, wherein the target region is capable of accommodating at least one additional power wiring and at least one additional ground wiring; determine a second layout of the semiconductor integrated circuit by modifying the first layout to include the at least one additional power wiring and the at least one additional ground wiring in the target region; and generate a second bitstream based on the second layout.

BRIEF DESCRIPTION OF DRAWINGS

The above and other aspects, features, and advantages of certain embodiments of the present disclosure will be more apparent from the following description taken in conjunction with the accompanying drawings, in which:

FIGS. 2, 3A and 3B are diagrams for describing a process of designing a layout of a semiconductor integrated circuit according to an embodiment;

FIGS. 7A, 7B and 7C are diagrams for describing operations of FIG. 6, according to an embodiment;

FIGS. 14A and 14B are diagrams for describing an operation of FIG. 13, according to an embodiment;

FIGS. 18 and 19 are flowchart illustrating other examples of setting a target region on a partial sub-region of at least one block in FIG. 15, according to an embodiment;

DETAILED DESCRIPTION

Figure 1:
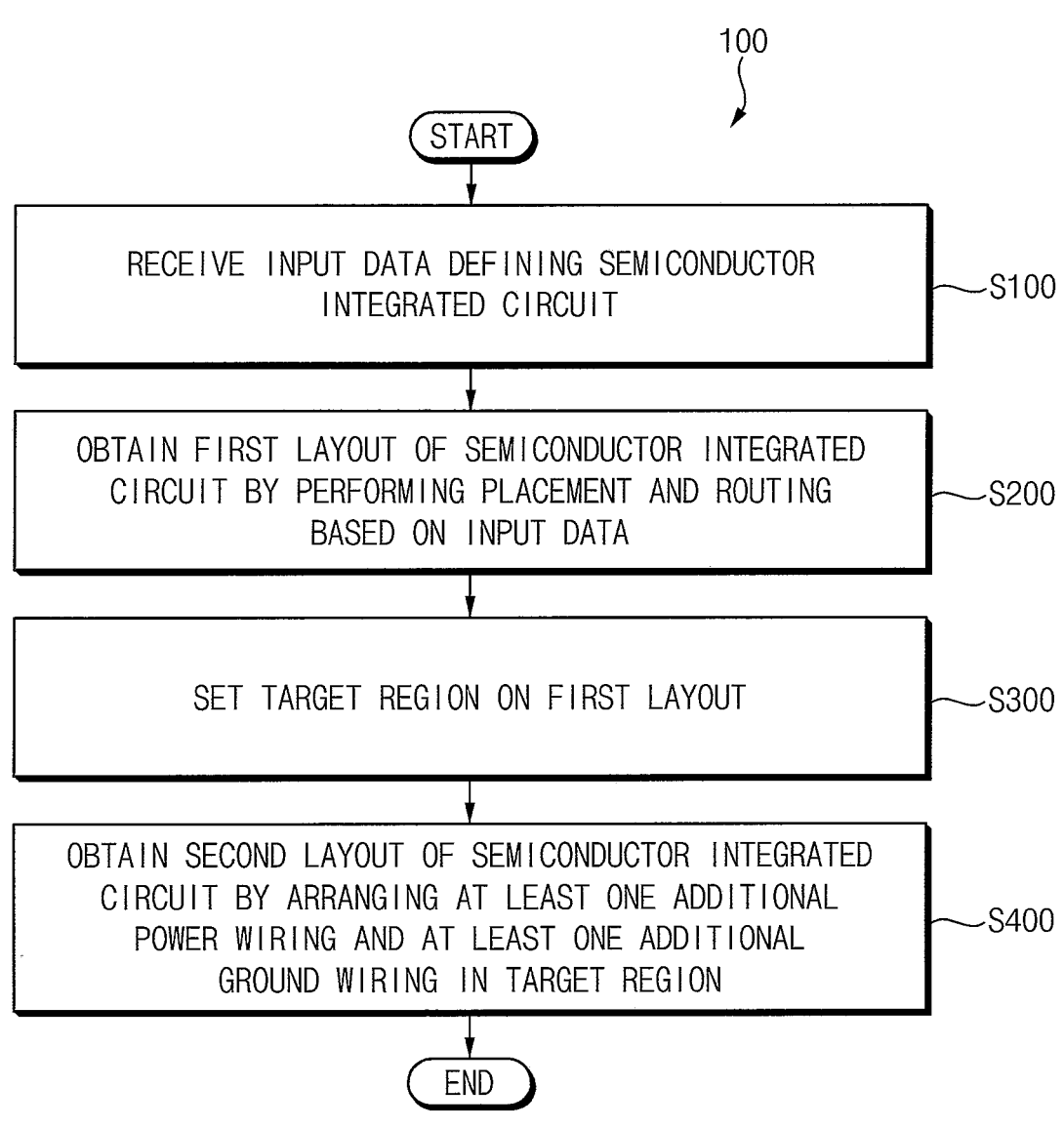
FIG. 1 is a flowchart illustrating a process of designing a layout of a semiconductor integrated circuit according to an embodiment.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

As is traditional in the field, embodiments may be described and illustrated in terms of blocks which carry out a described function or functions. These blocks, as shown in the drawings, which may be referred to herein as units or modules or the like, or by names such as circuit, placer, router analyzer, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

Figure 2:
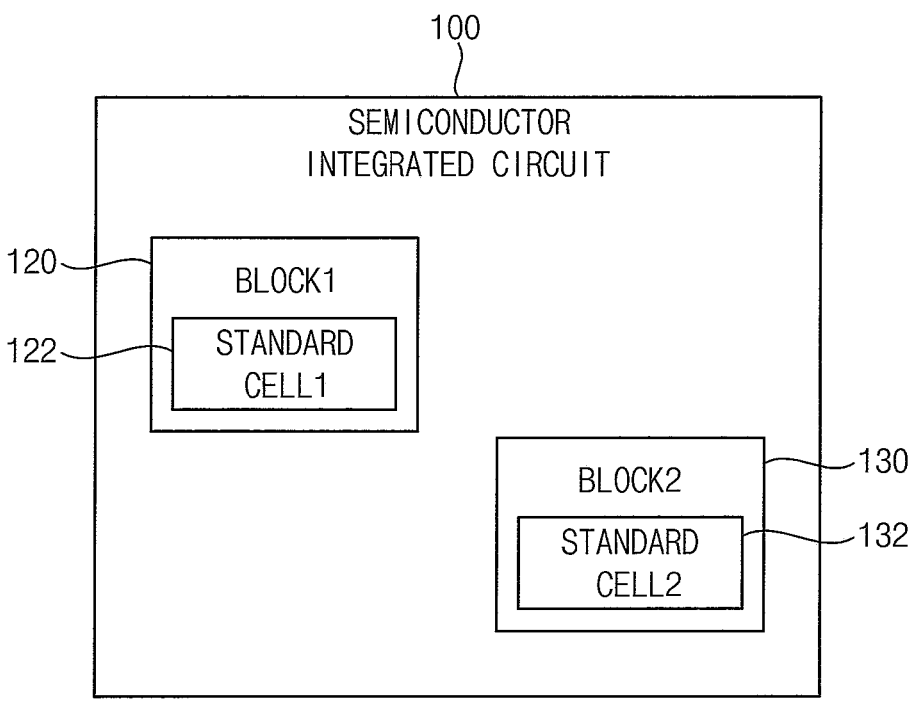
Figure 3A:
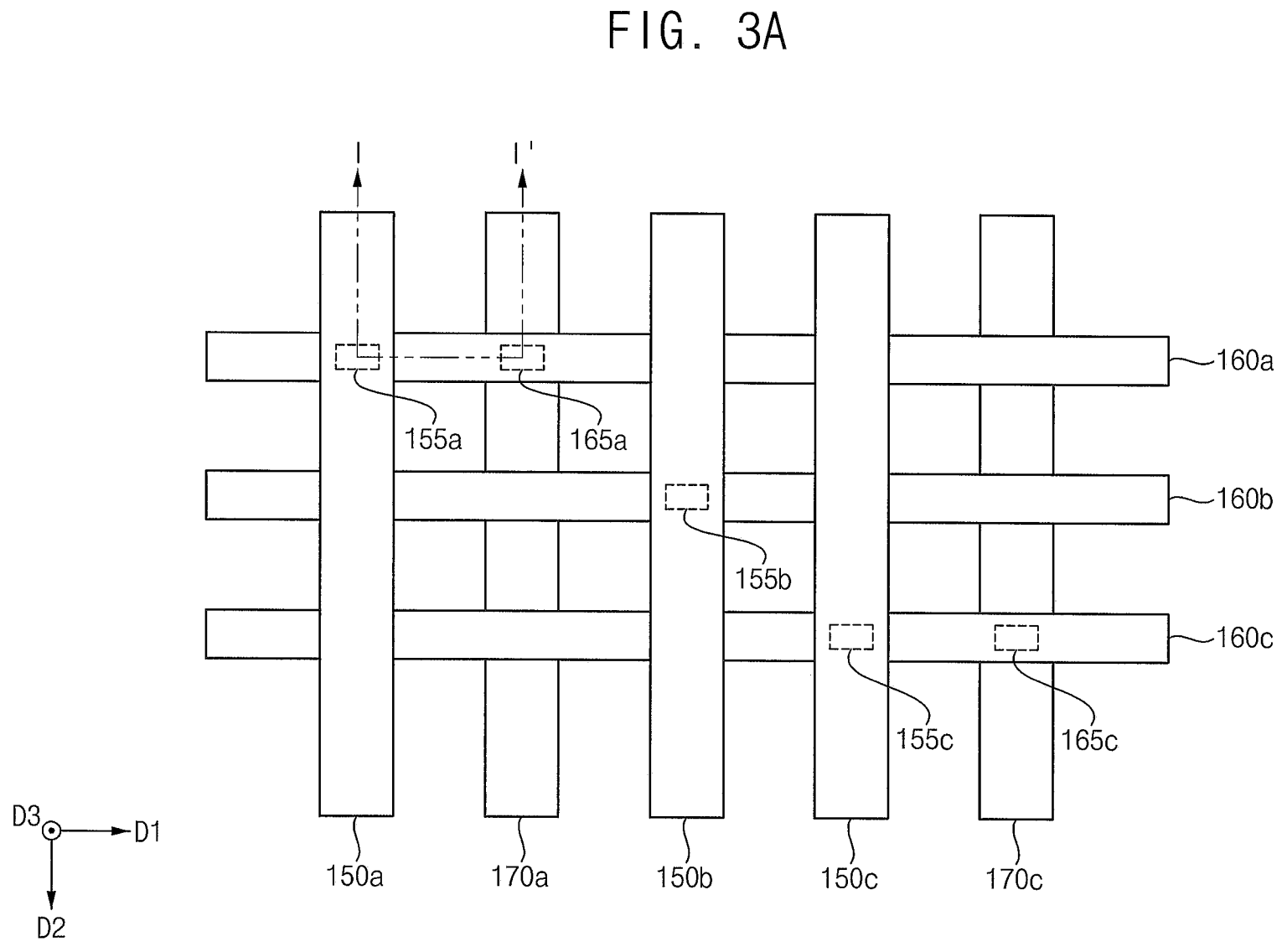
Figure 3B:
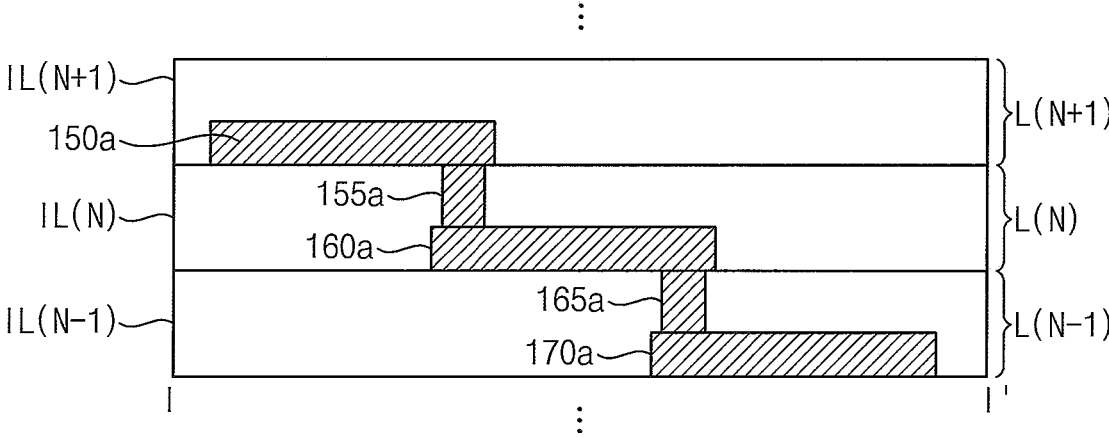
Figure 3B:
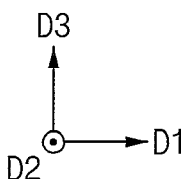

FIG. 1 is a flowchart illustrating a process of designing a layout of a semiconductor integrated circuit according to example embodiments. FIGS. 2, 3A and 3B are diagrams for describing a process of designing a layout of a semiconductor integrated circuit according to example embodiments. FIG. 2 is a plan view of an example of blocks and standard cells that are included in a layout of a semiconductor integrated circuit. FIG. 3A is a plan view of an example of wirings that are included in a layout of a semiconductor integrated circuit. FIG. 3B is a cross-sectional view of a layout of a semiconductor integrated circuit taken along line I-I' of FIG. 3A.

Referring to FIG. 1, a process 100 of designing a layout of a semiconductor integrated circuit according to example embodiments may be performed during a design process of the semiconductor integrated circuit, and may be performed in a system and/or a tool for designing the semiconductor integrated circuit. For example, the system and/or the tool for designing the semiconductor integrated circuit may include a program that includes a plurality of instructions executed by a processor. An example of the system and/or the tool is described with reference to FIGS. 4 and 5.

In the process 100 of designing the layout of the semiconductor integrated circuit according to example embodiments, input data defining the semiconductor integrated circuit (or a semiconductor device, a semiconductor chip) is received at operation S100. For example, the input data may correspond to a first layout in operation S200.

In some example embodiments, the input data may be data generated from an abstract form with respect to behavior of the semiconductor integrated circuit. For example, the input data may be defined in a register transfer level (RTL) through synthesis. For example, the input data may be a bitstream or a netlist that is generated by synthesizing the semiconductor integrated circuit defined by a hardware description language (HDL) such as Very High Speed Integrated Circuit (VHSIC) hardware description language (VHDL) or Verilog.

In other example embodiments, the input data may be data for defining the layout of the semiconductor integrated circuit. For example, the input data may include geometric information for defining a structure implemented as a semiconductor material, a conductor (e.g., metal), and an insulator. The layout of the semiconductor integrated circuit indicated by the input data may have a layout of the cells and conducting wires used to connect a cell to other cells, for example.

A first layout of the semiconductor integrated circuit is obtained by performing a placement and routing (P&R) based on the input data at operation S200. The first layout includes a plurality of blocks, a plurality of standard cells, a plurality of power wirings (or wires), a plurality of ground wirings, a plurality of clock wirings, and a plurality of signal wirings.

Referring to FIG. 2, a semiconductor integrated circuit 110 may include a plurality of blocks 120 and 130. The plurality of blocks 120 and 130 may be referred to as functional blocks or intellectual properties (IPs). For example, the plurality of blocks 120 and 130 may include macro blocks for processing and/or calculating data, and memory blocks for storing data.

The plurality of blocks 120 and 130 may include a plurality of standard cells 122 and 132. For example, the first block 120 may include the first standard cell 122, and the second block 130 may include the second standard cell 132. The term "standard cell" may refer to a unit of an integrated circuit in which a size of the layout meets a preset rule or criterion.

Functions and operations of the semiconductor integrated circuit 110 may be implemented by the plurality of blocks 120 and 130 and/or the plurality of standard cells 122 and 132 included in the semiconductor integrated circuit 110. In other words, the plurality of blocks 120 and 130 and/or the plurality of standard cells 122 and 132 may represent functional circuit blocks (or logic circuit blocks) predefined to be implemented in the semiconductor integrated circuit 110, in some cases the function may be parameterized. In embodiments, each of the plurality of blocks 120 and 130 and/or each of the plurality of standard cells 122 and 132 may include a plurality of elements (or components, devices) for the functions and operations of the semiconductor integrated circuit 110. For example, the plurality of elements may include active elements, passive elements, analog elements, digital elements, logic elements, or the like.

In embodiments, the plurality of blocks 120 and 130 and/or the plurality of standard cells 122 and 132 may be formed or disposed on a semiconductor substrate.

For convenience of illustration, FIG. 2 illustrates that the semiconductor integrated circuit includes two blocks and each block includes one standard cell. However, example embodiments are not limited thereto, and the number of blocks and standard cells included in the semiconductor integrated circuit may be variously determined according to example embodiments.

Referring to FIGS. 3A and 3B, the semiconductor integrated circuit 110 may include a plurality of wirings (or wiring lines) 150a, 150b, 150c, 160a, 160b, 160c, 170a and 170c, and a plurality of vias 155a, 155b, 155c, 165a and 165c. For example, the plurality of wirings 150a to 150c, 160a to 160c, 170a and 170c may include power wirings for supplying a power supply voltage to the blocks 120 and 130 and/or the standard cells 122 and 132, ground wirings for supplying a ground voltage to the blocks 120 and 130 and/or the standard cells 122 and 132, clock wirings for providing or transmitting clock signals to the blocks 120 and 130 and/or the standard cells 122 and 132, and signal wirings for providing or transmitting general signals other than the clock signals to the blocks 120 and 130 and/or the standard cells 122 and 132. For example, the plurality of wirings 150a to 150c, 160a to 160c, 170a and 170c may be formed of at least one conductive material selected from copper, tungsten, titanium, aluminum, or other conductive materials.

The first wirings 150a to 150c may be formed in a first wiring layer L(N+1), may be arranged or disposed in plural along a first direction D1, and may extend in a second direction D2 crossing (e.g., perpendicular to) the first direction D1. The second wirings 160a to 160c may be formed in a second wiring layer L(N), may be arranged or disposed in plural along the second direction D2, and may extend in the first direction D1. The third wirings 170a and 170c may be formed in a third wiring layer L(N−1), may be arranged or disposed in plural along the first direction D1, and may extend in the second direction D2. The wiring layers L(N+1), L(N) and L(N−1) may be stacked in a third direction D3 perpendicular to the first and second directions D1 and D2.

The first vias 155a to 155c may be formed in the third direction D3 at locations or positions at which the first wirings 150a to 150c and the second wirings 160a to 160c intersect, and may electrically connect the first wirings 150a to 150c with the second wirings 160a to 160c. The second vias 165a and 165c may be formed in the third direction D3 at locations or positions at which the second wirings 160a and 160c and the third wirings 170a and 170c intersect, and may electrically connect the second wirings 160a and 160c with the third wirings 170a and 170c.

Therefore, as illustrated in FIG. 3B, the wirings 150a, 160a and 170a formed in different wiring layers L(N+1), L(N) and L(N−1) may be electrically connected to each other by the vias 155a and 165a. Similarly, the wirings 150b and 160b may be electrically connected to each other by the via 155b, and the wirings 150c, 160c and 170c may be electrically connected to each other by the vias 155c and 165c. For example, the vias 155a to 155c, 165a and 165c may be implemented in various forms, such as single vias, bar vias, staple vias, or the like.

The wiring layers L(N+1), L(N) and L(N−1) may further include insulation layers IL(N+1), IL(N) and IL(N−1), respectively, that are formed on the wirings 150a to 150c, 160a to 160c, 170a and 170c. For example, the wiring layers L(N+1), L(N) and L(N−1) may include a standard-cell-level wiring layer that is the lowest-level layer and is connected to standard cells, a block-level wiring layer that is a layer having higher level than the standard-cell-level wiring layer and is connected to blocks, and a chip-level wiring layer that is the highest-level layer and is connected to the semiconductor integrated circuit or chip.

For convenience of illustration, FIGS. 3A and 3B illustrate that the semiconductor integrated circuit includes three wiring layers and each wiring layer includes two or three wirings. However, example embodiments are not limited thereto, and the number of wiring layers and wirings included in the semiconductor integrated circuit may be variously determined according to example embodiments.

Referring again to FIG. 1, a target region (or area) is set on the first layout at operation S300. The target region represents a region suitable for arranging or disposing at least one additional power wiring and at least one additional ground wiring. In embodiments, the region may be suitable for arranging or disposing at least one additional power wiring and at least one additional ground wiring by being capable of accommodating the at least one additional power wiring and at least one additional ground wiring. For example, the target region may be an unused region or a remaining region (e.g., a white space or empty space) in the first layout.

In some example embodiments, the target region may be set on a partial region of the semiconductor integrated circuit. In other words, the target region may be set in units of semiconductor integrated circuits.

In other example embodiments, the target region may be set on a partial sub-region of one block among the plurality of blocks included in the semiconductor integrated circuit. In other words, the target region may be set in units of blocks.

In still other example embodiments, the target region may be set on both a partial region of the semiconductor integrated circuit and a partial sub-region of one block.

A second layout of the semiconductor integrated circuit is obtained by arranging or disposing the at least one additional power wiring and the at least one additional ground wiring in the target region at operation S400. For example, the first layout and the second layout may be logically the same as each other, but may be physically different from each other by arranging the additional power wiring and the additional ground wiring. For example, when the additional power wiring and the additional ground wiring are arranged, a routing capacitance may be increased or reinforced, and an effective resistance may be decreased.

In some example embodiments, operations S300 and S400 may be sequentially performed. In other example embodiments, operations S300 and S400 may be substantially simultaneously or concurrently performed. An example of operation S300 is described in detail below with reference to FIGS. 8 through 19, and an example of operation S400 is described in detail below with reference to FIGS. 20 through 23.

In some example embodiments, after operation S400 is performed, output data defining the semiconductor integrated circuit may be generated and provided. For example, the output data may correspond to the second layout in operation S400.

In some example embodiments, when the received input data is data such as a bitstream or a netlist generated by synthesizing the semiconductor integrated circuit, the output data may also be the bitstream or the netlist. In other example embodiment, when the received input data is data defining the layout of the semiconductor integrated circuit, for example, data having a graphic data system II (GDSII) format, a format of the output data may also be data defining the layout of the semiconductor integrated circuit.

In some example embodiments, the above-described operations may be performed by designing the semiconductor integrated circuit using a design tool. For example, the design tool may include a Fusion Compiler tool from Synopsys, Inc., or an Innovus tool from Cadence Design Systems, Inc. However, example embodiments are not limited thereto.

In some example embodiments, the semiconductor integrated circuit may be or include a system-on-chip (SoC).

In the process of designing the layout of the semiconductor integrated circuit according to example embodiments, a power gating connection in which the additional power wiring and the additional ground wiring are arranged in the unused region, the remaining region and/or the white space may be performed after the placement and routing is performed on the elements included in the semiconductor integrated circuit. The additional power wiring and the additional ground wiring may be electrically connected to the plurality of power wirings and the plurality of ground wirings, respectively. Accordingly, the robust design may be implemented by effectively utilizing the white space, and the semiconductor integrated circuit may have improved or enhanced performance.

Figure 4:
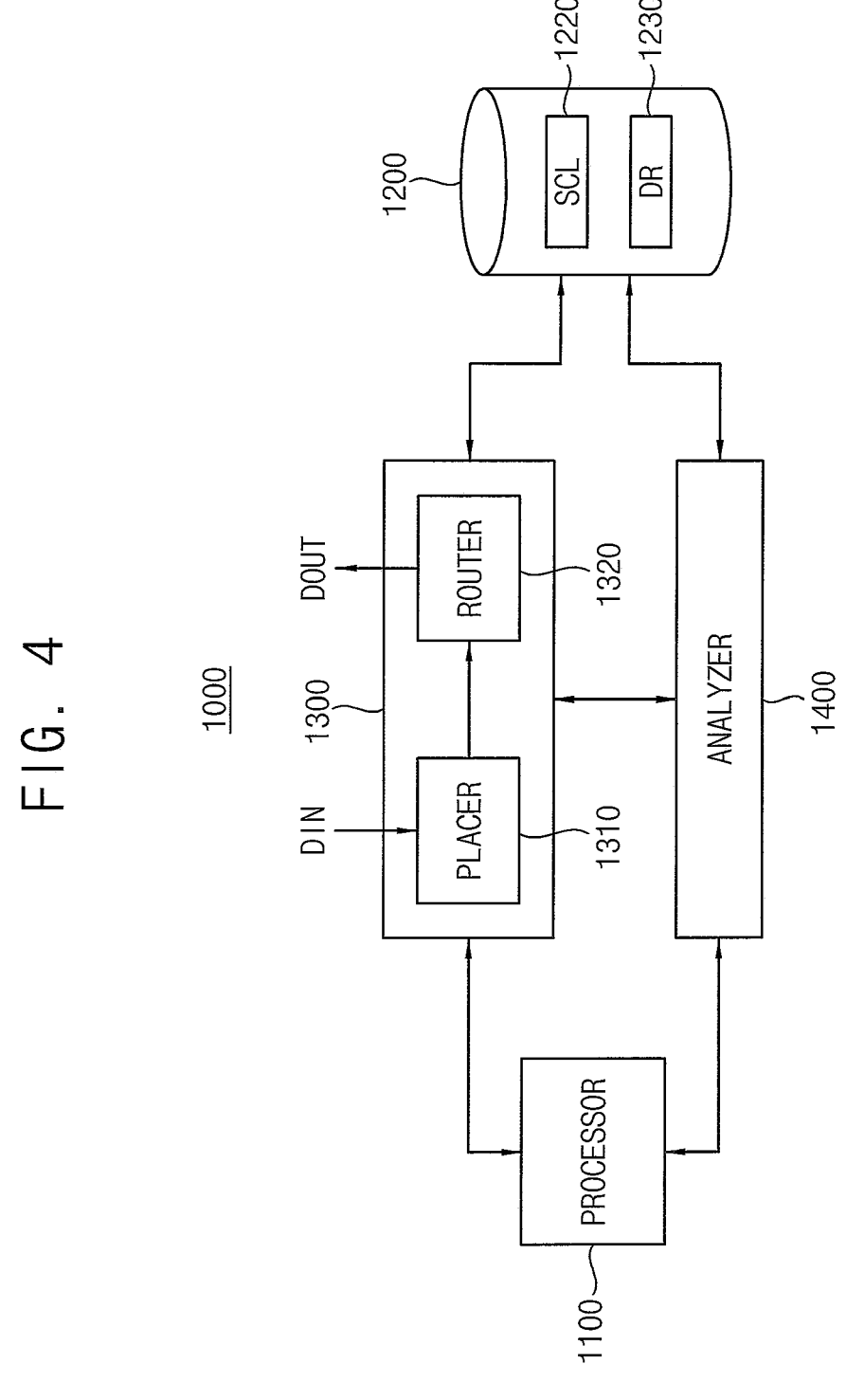
FIGS. 4 and 5 are block diagrams illustrating a design system for a semiconductor integrated circuit according to an embodiment.
Figure 5:
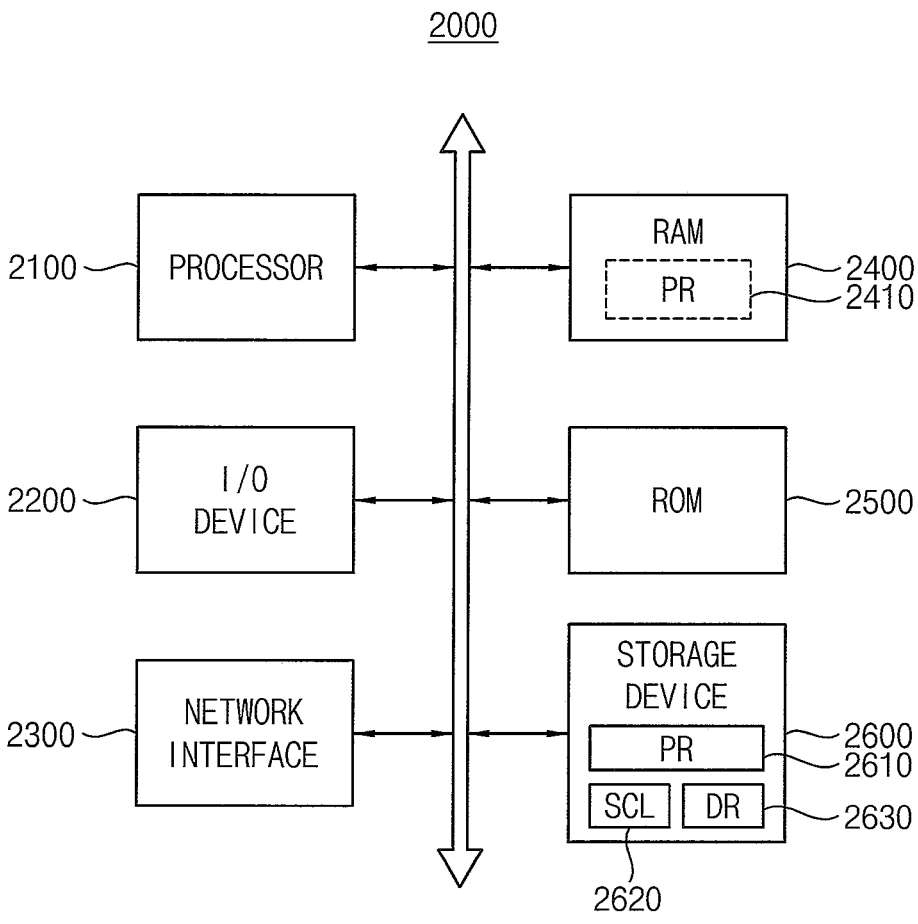

FIGS. 4 and 5 are block diagrams illustrating a design system for a semiconductor integrated circuit according to example embodiments.

Referring to FIG. 4, a design system 1000 for a semiconductor integrated circuit includes a processor 1100, a storage device 1200, a design module 1300 and an analyzer (or analysis module) 1400.

Herein, the term "module" may indicate, but is not limited to, a software and/or hardware component, such as a field programmable gate array (FPGA) or an application specific integrated circuit (ASIC), which performs certain tasks. A module may be configured to reside in a tangible addressable storage medium and be configured to execute on one or more processors. For example, a "module" may include components such as software components, object-oriented software components, class components and task components, and processes, functions, Routines, segments of program code, drivers, firmware, microcode, circuitry, data, databases, data structures, tables, arrays, and variables. A "module" may be divided into a plurality of "modules" that perform detailed functions.

The processor 1100 may be used when the design module 1300 and/or the analyzer 1400 perform computations or calculations. For example, the processor 1100 may include a microprocessor, an application processor (AP), a central processing unit (CPU), a digital signal processor (DSP), a graphic processing unit (GPU), or the like. Although FIG. 4 illustrates that the design system 1000 includes one processor 1100, example embodiments are not limited thereto. For example, the design system 1000 may include a plurality of processors. In addition, the processor 1100 may include cache memories to increase computation capacity.

The storage device 1200 may include a standard cell library (SCL) 1220 and a design rule (DR) 1230. The standard cell library SCL 1220 and the design rule 1230 may be provided from the storage device 1200 to the design module 1300 and/or the analyzer 1400. For example, the standard cell library SCL 1220 may include information associated with or related to standard cells, and the design rule DR 1230 may be used to verify a result of the placement and routing.

In some example embodiments, the storage device 1200, which may be for example a storage medium, may include any non-transitory computer-readable storage medium used to provide commands and/or data to a computer. For example, the non-transitory computer-readable storage medium may include a volatile memory such as a static random access memory (SRAM), a dynamic random access memory (DRAM), or the like, and a nonvolatile memory such as a flash memory, a magnetic random access memory (MRAM), a phase-change random access memory (PRAM), a resistive random access memory (RRAM), or the like. The non-transitory computer-readable storage medium may be inserted into the computer, may be integrated in the computer, or may be coupled to the computer through a communication medium such as a network and/or a wireless link.

The design module 1300 may include a placer 1310 and a router 1320.

The placer 1310 may place or arrange, using the processor 1100, a plurality of blocks and a plurality of standard cells based on input data DIN defining the semiconductor integrated circuit and the standard cell library SCL 1220. The router 1320 may perform signal routing with respect to the placement provided from the placer 1310.

The analyzer 1400 may analyze and verify the result of the placement and routing. When it is determined based on a result of the analysis that the signal routing is not successfully completed, the placer 1310 may modify the previous placement and the router 1320 may perform the signal routing with respect to the modified placement. When it is determined based on the result of the analysis that the signal routing is successfully completed, the router 1320 may provide output data DOUT defining the semiconductor integrated circuit.

The design module 1300 may perform the process 100 of designing the layout of the semiconductor integrated circuit according to example embodiments described with reference to FIG. 1. For example, at least one of the placer 1310 and the router 1320 that are included in the design module 1300 may perform operations S100, S200, S300 and S400 in FIG. 1. In addition, the design module 1300 may perform a process 2400 of designing a semiconductor integrated circuit according to example embodiments, an example of which is described below with reference to FIG. 24.

In some example embodiments, the placer 1310 and the router 1320 may be implemented as a single integrated module. In other example embodiments, the placer 1310 and the router 1320 may be implemented as separate and different modules.

The design module 1300 and/or the analyzer 1400 may be implemented in software, but example embodiments are not limited thereto. When both the design module 1300 and the analyzer 1400 are implemented in software, the design module 1300 and the analyzer 1400 may be stored in the form of code in the storage device 1200, or may be stored in the form of code in another storage device separate from the storage device 1200.

Referring to FIG. 5, a design system 2000 for a semiconductor integrated circuit includes a processor 2100, an input/output (I/O) device 2200, a network interface 2300, a random access memory (RAM) 2400, a read only memory (ROM) 2500 and a storage device 2600. FIG. 5 illustrates an example where both the design module 1300 and the analyzer 1400 in FIG. 4 are implemented in software.

The design system 2000 may be a computing system. For example, the computing system may be a fixed computing system such as a desktop computer, a workstation or a server, or may be a portable computing system such as a laptop computer.

The processor 2100 may be substantially the same as the processor 1100 in FIG. 4. For example, the processor 2100 may include a core or a processor core for executing an arbitrary instruction set (for example, intel architecture-32 (IA-32), 64 bit extension IA-32, x86-64, PowerPC, Sparc, MIPS, ARM, IA-64, etc.). For example, the processor 2100 may access a memory (e.g., the RAM 2400 or the ROM 2500) through a bus, and may execute instructions stored in the RAM 2400 or the ROM 2500. As illustrated in FIG. 5, the RAM 2400 may store a program PR 2410 corresponding to the design module 1300 and/or the analyzer 1400 in FIG. 4 or at least some elements of the program PR 2410, and the program PR 2410 may allow the processor 2100 to perform operations of verifying and/or designing a semiconductor integrated circuit.

In other words, the program PR 2410 may include a plurality of instructions and/or procedures executable by the processor 2100, and the plurality of instructions and/or procedures included in the program PR may allow the processor 2100 to perform the processes of designing the layout of the semiconductor integrated circuit and/or the semiconductor integrated circuit according to example embodiments. Each of the procedures may denote a series of instructions for performing a certain task. A procedure may be referred to as a function, a routine, a subroutine, or a subprogram. Each of the procedures may process data provided from the outside and/or data generated by another procedure.

The storage device 2600 may be substantially the same as the storage device 1200 in FIG. 4. For example, the storage device 2600 may store the program PR 2610, which may correspond to the program PR 2410 stored in the RAM 2400, and may store a standard cell library SCL 2620 and a design rule DR 2630. In embodiments, the standard cell library SCL 2620 and a design rule DR 2630 stored in storage device 2600 may correspond to the standard cell library SCL 1220 and the design rule DR 1230 discussed above. The program PR 2610 or at least some elements of the program PR 2610 may be loaded from the storage device 2600 to the RAM 2400 before being executed by the processor 2100. The storage device 2600 may store a file written in a program language, and the program PR 2610 generated by a compiler or the like or at least some elements of the program PR 2610 may be loaded to the RAM 2400.

The storage device 2600 may store data, which is to be processed by the processor 2100, or data obtained through processing by the processor 2100. The processor 2100 may process the data stored in the storage device 2600 to generate new data, based on the program PR 2610 or the corresponding program PR 2410, and may store the generated data in the storage device 2600.

The I/O device 2200 may include an input device, such as a keyboard, a pointing device, or the like, and may include an output device such as a display device, a printer, or the like. For example, a user may trigger, through the I/O devices 2200, execution of the program PR 2610 or the corresponding program PR 2410 by the processor 2100 or may input the input data DIN in FIG. 4, and may check the output data DOUT in FIG. 4, an error message, etc.

The network interface 2300 may provide access to a network outside the design system 2000. For example, the network may include a plurality of computing systems and communication links, and the communication links may include wired links, optical links, wireless links, or arbitrary other type links. The input data DIN in FIG. 4 may be provided to the design system 2000 through the network interface 2300, and the output data DOUT in FIG. 4 may be provided to another computing system through the network interface 2300.

Figure 6:
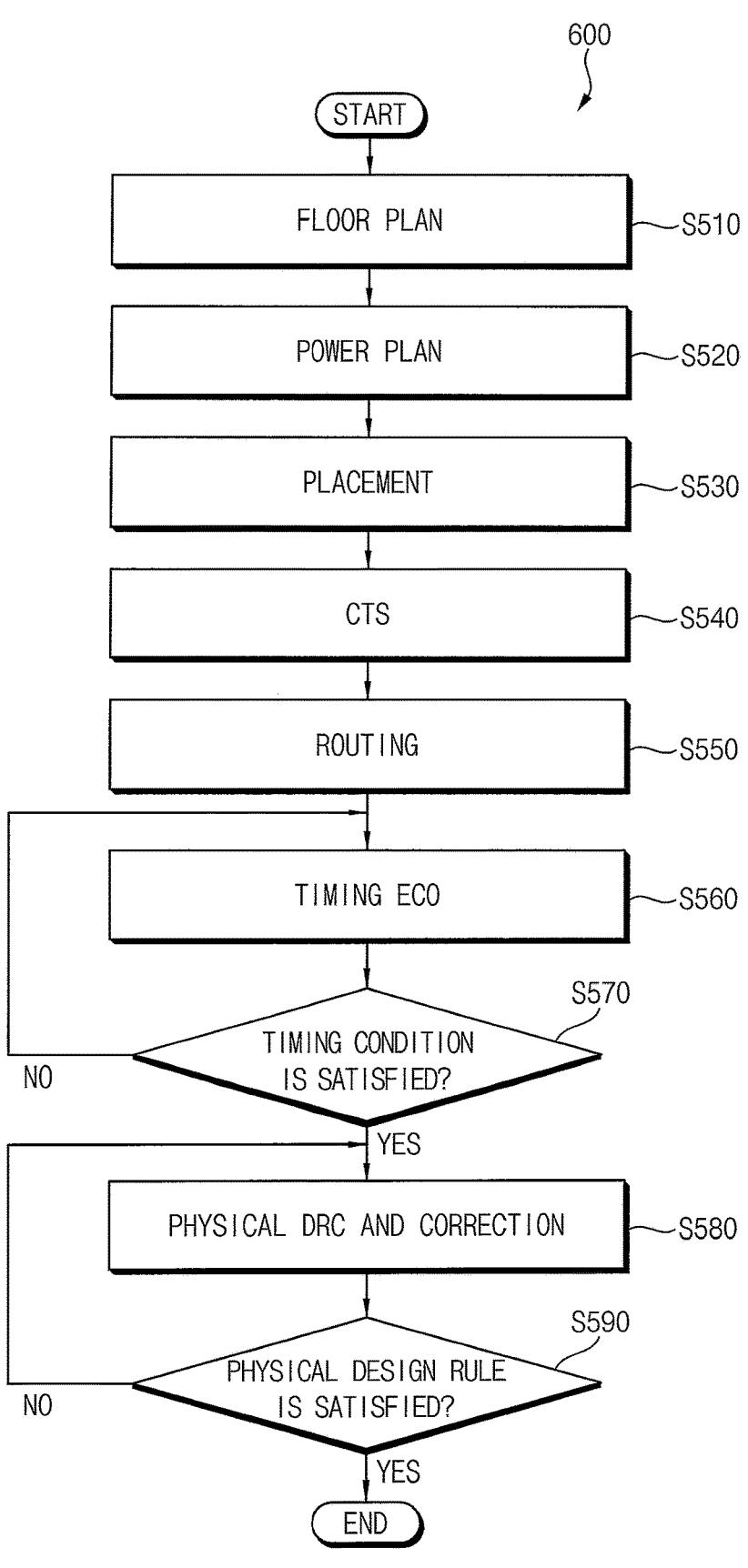
FIG. 6 is a flowchart illustrating an example of a process of designing a layout of a semiconductor integrated circuit according to an embodiment.
Figure 7A:
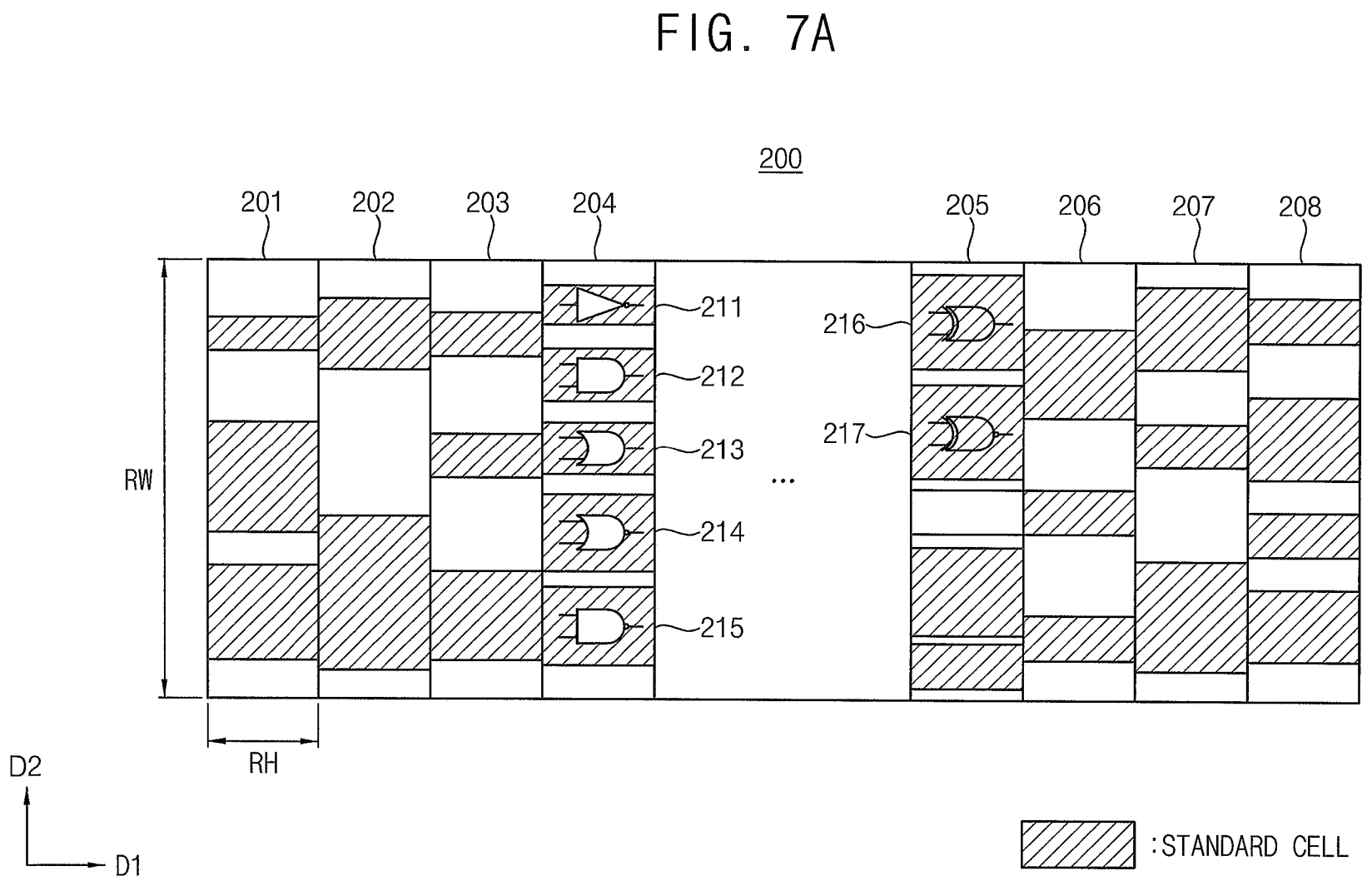
Figure 7B:
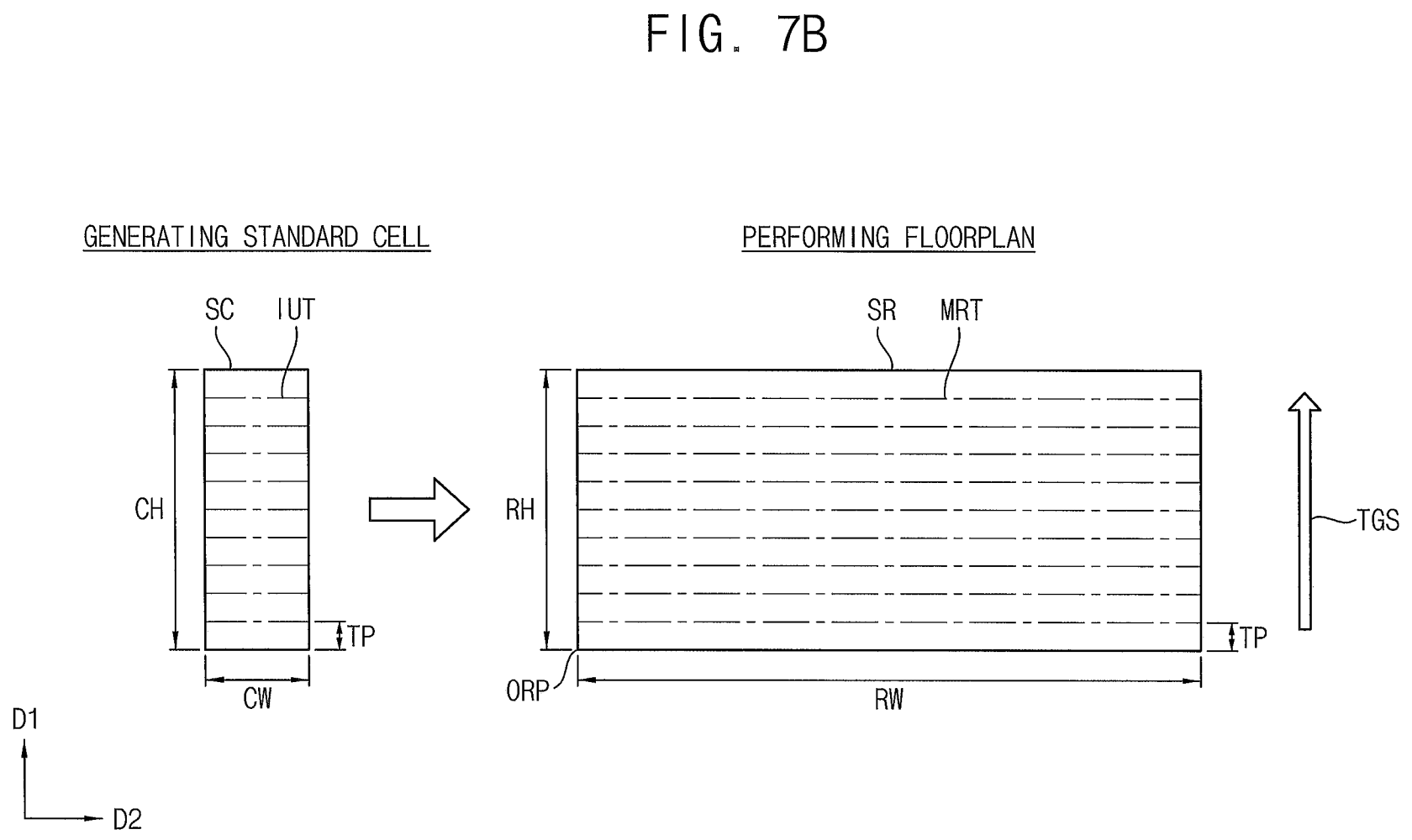
Figure 7C:
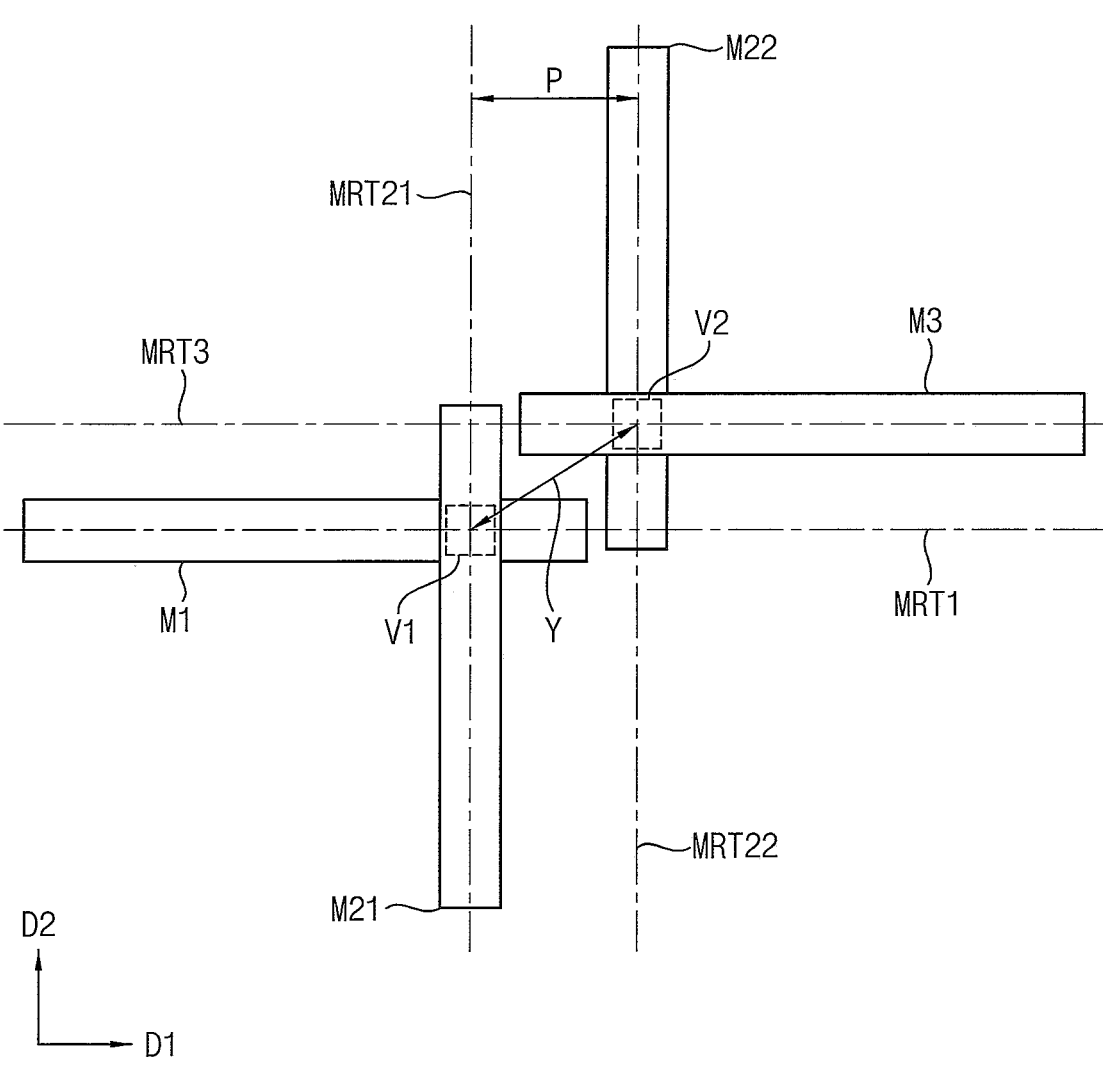

FIG. 6 is a flowchart illustrating an example of a process 600 of designing a layout of a semiconductor integrated circuit according to example embodiments. FIGS. 7A, 7B and 7C are diagrams for describing operations of FIG. 6.

Referring to FIG. 6, when designing the layout of the semiconductor integrated circuit, a floor plan of the plurality of blocks and the plurality of standard cells that are included in the semiconductor integrated circuit may be performed or determined at operation S510. The floor plan may include schematic placement information of gates in a block included in a semiconductor integrated circuit. In other words, the floor plan may represent an operation of cutting and shifting a logically designed schematic circuit and then physically designing the circuit, that is, an operation of generating a layout pattern of memory or functional blocks for actual fabrication.

Next, a power plan of the plurality of power wirings and the plurality of ground wirings that are included in the semiconductor integrated circuit may be performed or determined at operation S520. The power plan may include schematic routing information of a power grid for supplying power to the gates. In other words, the power plan may represent an operation of generating a layout pattern of wirings (e.g., a wiring layout pattern) for connecting local power (e.g., a driving voltage) or a ground to the arranged functional blocks. For example, a wiring layout pattern for connecting power or a ground may be generated in the form of a mesh such that the power is uniformly supplied to the entire chip. In this regard, all patterns may be provided in the form of a mesh based on various rules.

After that, a placement of the elements that are included in the plurality of blocks and the plurality of standard cells may be performed or determined at operation S530. The placement may include an operation of determining where to place the gates in the block. In other words, the placement may represent an operation of generating a placement pattern of elements constituting each functional block.

After that, a clock tree synthesis (CTS) of clock signals that are provided to the elements via the plurality of clock wirings may be performed or determined at operation S540. The CTS may represent an operation of generating a layout pattern of signal lines for a central clock related to a response time for determining the performance of the semiconductor integrated circuit.

After that, a routing (or signal routing) of general signals (or normal signals) that are provided to the elements via the plurality of signal wirings may be performed or determined at operation S550. The routing may include an operation of determining how to route wires connecting the gates in the block. In other words, the routing may represent an operation of generating a layout pattern of general signal lines. The term "general signal lines" may denote signal lines for transmitting general control signals, input signals or output signals, rather than clock signal lines for transmitting the clock signals.

After that, a result of the placement performed in operation S530, a result of the CTS performed in operation S540 and a result of the routing performed in operation S550 may be verified.

When verifying, a timing engineering change order (ECO) process may be performed first at operation S560. For example, the timing ECO process may include a static timing analysis (STA) operation and a timing update operation. For example, the timing ECO process may include a timing optimization operation.

After that, it may be determined whether a predetermined timing condition is satisfied at operation S570. For example, operation S570 may include an operation of determining whether a timing violation occurs. For example, it may be determined whether a setup timing violation occurs, or whether a hold timing violation of a flip-flop occurs.

If the predetermined timing condition is not satisfied (NO at operation S570), operations S560 and S570 may be repeated. For example, to solve or improve the timing violation detected in operation S570 through the timing ECO process, cells and power lines in the semiconductor integrated circuit may be appropriately placed and routed. Also, in the timing ECO process, a cell size or location may be adjusted, a buffer may be inserted, or the lengths or widths of power lines in the semiconductor integrated circuit may be adjusted.

If the predetermined timing condition is satisfied (YES at operation S570), a predetermined physical design rule check (DRC) and correction may be performed at operation S580. For example, operation S580 may be performed based on the design rule DR 1230 stored in the storage device 1200 in FIG. 4 or design rule DR 2630 stored the storage device 2600 in FIG. 5.

After that, it may be checked whether the physical design rule is satisfied at operation S590. If the physical design rule is not satisfied (NO at operation S590), operations S580 and S590 may be repeated. If the physical design rule is satisfied (YES at operation S590), the design process may be completed.

In some example embodiments, the operation of obtaining the first layout of the semiconductor integrated circuit by performing the placement and routing (e.g., operation S200 in FIG. 1) may include operations S510, S520, S530, S540 and S550. For example, operations S510 to S550 may be performed based on the input data (e.g., the input data DIN in FIG. 4).

In some example embodiments, the operation of setting the target region on the first layout (e.g., operation S300 in FIG. 1) and the operation of obtaining the second layout of the semiconductor integrated circuit by arranging the at least one additional power wiring and the at least one additional ground wiring in the target region (e.g., operation S400 in FIG. 1) may be performed while verifying the result of the placement and routing. For example, operations S300 and S400 in FIG. 1 may be performed while the timing ECO process of operations S560 and S570 is performed and while it is determined whether the predetermined timing condition is satisfied.

In some example embodiments, operations in FIG. 6 may be performed for the entire semiconductor integrated circuit. In other words, the entire semiconductor integrated circuit may be designed at one time or at once.

In other example embodiments, operations in FIG. 6 may be performed for each of the plurality of blocks included in the semiconductor integrated circuit. As the semiconductor integrated circuit is highly integrated, it may be difficult to design the entire semiconductor integrated circuit at one time, and thus the semiconductor integrated circuit may be designed by dividing the semiconductor integrated circuit into the plurality of blocks, by separately designing each of the plurality of blocks, and by integrating the plurality of designed blocks. In other words, operations in FIG. 6 may be performed in units of blocks.

Referring to FIG. 7A, an example of a block 200, which is included in a semiconductor integrated circuit designed by the operations of FIG. 6, is illustrated.

The block 200 may include a plurality of rows 201, 202, 203, 204, 205, 206, 207 and 208, which may also be referred to as site-rows, and a plurality of components represented by a plurality of standard cells 211, 212, 213, 214, 215, 216 and 217.

The plurality of standard cells 211 to 217 may be generated based on a stored or input standard cell library (e.g., the standard cell library SCL 1220 in FIG. 4 and the standard cell library SCL 2620 in FIG. 5). In FIG. 7A, rectangles which are cross-hatched are the standard cells. The numbers of transistors of the various types of standard cells may differ from one another and so, the standard cells 211 to 217 may have different functions from one another. For example, the standard cell 211 may perform a function of an inverter. The standard cell 212 may perform an AND function. The standard cell 213 may perform an OR function. The standard cell 214 may perform a function of a NOR gate. The standard cell 215 may perform a function of a NAND gate. The standard cell 216 may perform a function of an XOR gate. The standard cell 217 may perform a function of an XNOR gate. Standard cells that perform other functions of various logical circuits may be generated. The standard cells 211 to 217 may have various sizes according to their respective functions, however, all of the standard cells 211 to 217 may have the same unit height. In any case, various types of standard cells may be combined with one another to constitute a functional circuit or functional block.

The row or site-row may be a frame in which the standard cells are laid out in the schematic of the automatically designed block 200. The plurality of rows 201 to 208 may be generated by a design system (e.g., an electronic design automation (EDA) tool). Each of the rows 201 to 208 may have a row height RH in a first direction D1 and may have a row width RW in a second direction D2. For example, the row height RH may be a unit height which is the same as that of each standard cell. The row width RW may be changed according to a function of the block 200. The rows 201 to 208 may be generated in sequence from the row 201 to the row 208 along the first direction D1. The number of rows 201 to 208 may be determined according to the function of the block 200.

The standard cells may be laid out in the rows 201 to 208 according to a circuit configuration of the block 200. For example, the standard cells may be disposed in the rows 201 to 208 and interconnections of the standard cells may be designed. in embodiments, the standard cells may be connected to one another by metal wirings (or metal lines). The metal wirings may be included in a plurality of layers. The layers may be stacked in a third direction (e.g., the third direction D3 in FIG. 3B) perpendicular to the first direction D1 and the second direction D2. Metal wirings of each layer may be formed in a direction perpendicular to metal wirings of each layer adjacent thereto. For example, when metal wirings of the lowermost first layer is formed in the first direction D1, metal wirings of a second layer adjacent to the first layer may be formed in the second direction D2. For example, a unit height of the standard cell or the row may be determined based on the spacing of metal wirings of the second layer formed in the second direction D2.

Referring to FIG. 7B, an example of generating a standard cell and a row is illustrated.

A design system tool may generate standard cells SC, may perform a floor plan based on sizes of the standard cells SC, and may design rows SR and metal routing tracks MRT for the rows SR. The metal routing tracks MRT may be virtual lines along which metal wirings of the semiconductor integrated circuit may be laid out and are to run to connect the standard cells SC in the rows SR.

In FIG. 7B, the standard cell SC having a cell height CH in the first direction D1 and a cell width CW in the second direction D2 may be generated. For example, all of the standard cells may have the same unit height as the cell height CH. However, each standard cell may have a variety of cell widths CW depending on the type.

The design system may generate the standard cell SC having the unit height that is an integer multiple of the spacing of metal wirings to be formed along the metal routing tracks MRT in the second direction D2. In other words, the cell height CH may be an integer multiple of the space between adjacent ones of the metal wirings. The design system may form internal unit tracks IUT in the standard cell SC at a track pitch TP corresponding to the spacing of the metal wirings. Each of the internal unit tracks IUT may be a virtual line corresponding to the metal routing tracks MRT of the row SR. Contact points of transistors of the standard cell SC may exist on the internal unit tracks IUT.

The design system may generate the row SR based on the unit height of the standard cell SC. In other words, the row height RH may be the unit height. The design system may generate the metal routing tracks MRT at the track pitch TP from an origin point ORP in a direction of an arrow TGS.

The unit height of the standard cell SC may be designed as an integer multiple of the space between the metal wirings according to a standardized floor plan rule of the design system regardless of sizes of n-type metal oxide semiconductor (NMOS) transistors and/or p-type metal oxide semiconductor (PMOS) transistors of the standard cells.

Referring to FIG. 7C, an example of metal routing tracks corresponding to virtual lines for the arrangement of metal wirings is illustrated.

Metal routing tracks may be generated repeatedly in a design area of the block according to a predetermined spacing value. For example, the metal routing tracks may be generated repeatedly at regular intervals from the bottom to the top of the physical design area. In some cases, even with metal routing tracks corresponding to the same layer, an interval between metal routing tracks may be a first interval in some areas, and an interval between metal routing tracks may be a second interval different from the first interval in other areas. In addition, the metal routing tracks may generally be generated to follow a certain direction.

For example, physical information associated with the metal wirings may include information of a first wiring layer, a second wiring layer and a third wiring layer formed at different levels, and may include information of a first via V1 and a second via V2 formed at different levels.

The first wiring layer may be, for example, a layer on which a metal wiring M1 is disposed, and may be formed at a first level. A first metal routing track MRT1 may be a routing track for arranging the metal wiring M1 of the first wiring layer, and may be generated along a certain direction such as the first direction D1.

The second wiring layer may be, for example, a layer on which metal wirings M21 and M22 are disposed, and may be formed at a second level higher than the first level. Second metal routing tracks MRT21 and MRT22 may be routing tracks for arranging the metal wirings M21 and M22 of the second wiring layer, and may be generated along a certain direction such as the second direction D2 perpendicular to the first direction D1.

The third wiring layer may be, for example, a layer on which a metal wiring M3 is disposed, and may be formed at a third level higher than the second level. A third metal routing track MRT3 may be a routing track for arranging the metal wiring M3 of the third wiring layer, and may be generated along a certain direction such as the first direction D1.

Heights of the first, second and third levels may represent heights in a third direction perpendicular to both the first direction D1 and the second direction D2.

The first via V1 may be formed on the first wiring layer to connect the first wiring layer with the second wiring layer.

For example, the first via V1 may be formed on the metal wiring M1 of the first wiring layer to provide an electrical connection with the metal wiring M21 of the second wiring layer.

The second via V2 may be formed on the second wiring layer to connect the second wiring layer with the third wiring layer. For example, the second via V2 may be formed on the metal wiring M22 of the second wiring layer to provide an electrical connection with the metal wiring M3 of the third wiring layer.

In addition, the physical information associated with the metal wirings may further include via spacing rule information Y between the first via V1 and the second via V2 and pitch information P of the second wiring layer. The via spacing rule information Y may be information representing a design rule that defines how far apart the first via V1 and the second via V2 formed at different levels should be from each other. The pitch information P may be information representing a distance between the second metal routing tracks MRT21 and MRT22 repeatedly generated at regular intervals in the second wiring layer. In other words, the pitch information P may represent a distance between center lines of the metal wirings M21 and M22. The block may be designed to satisfy the via spacing rule information Y and the pitch information P.

Figure 8:
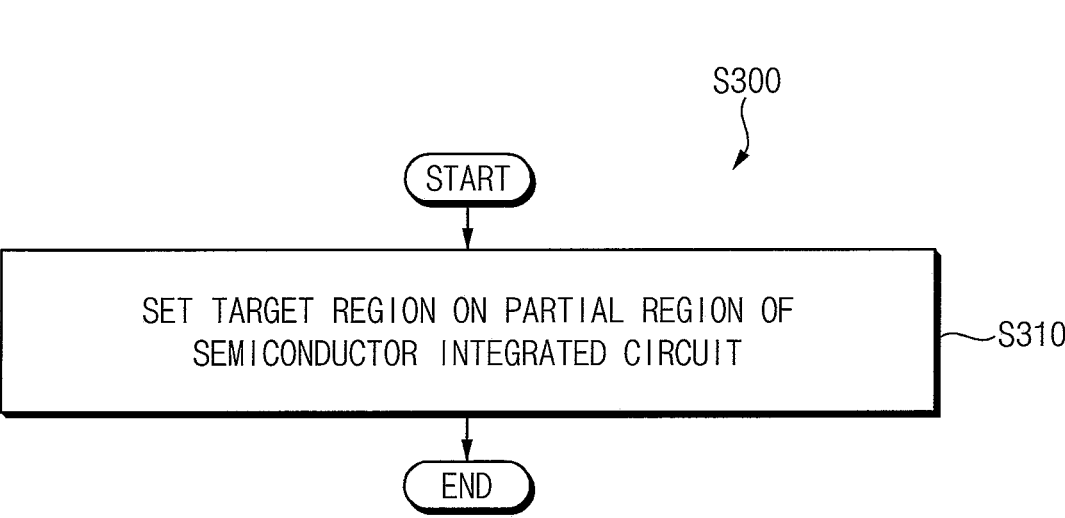
FIG. 8 is a flowchart illustrating an example of setting a target region on a first layout in FIG. 1, according to an embodiment.

FIG. 8 is a flowchart illustrating an example of setting a target region on a first layout in FIG. 1.

Referring to FIGS. 1 and 8, when setting the target region on the first layout at operation S300, the target region may be set on a partial region of the semiconductor integrated circuit at operation S310. For example, an unused region, a remaining region or a white space in the semiconductor integrated circuit may be set as the target region.

Figure 9:
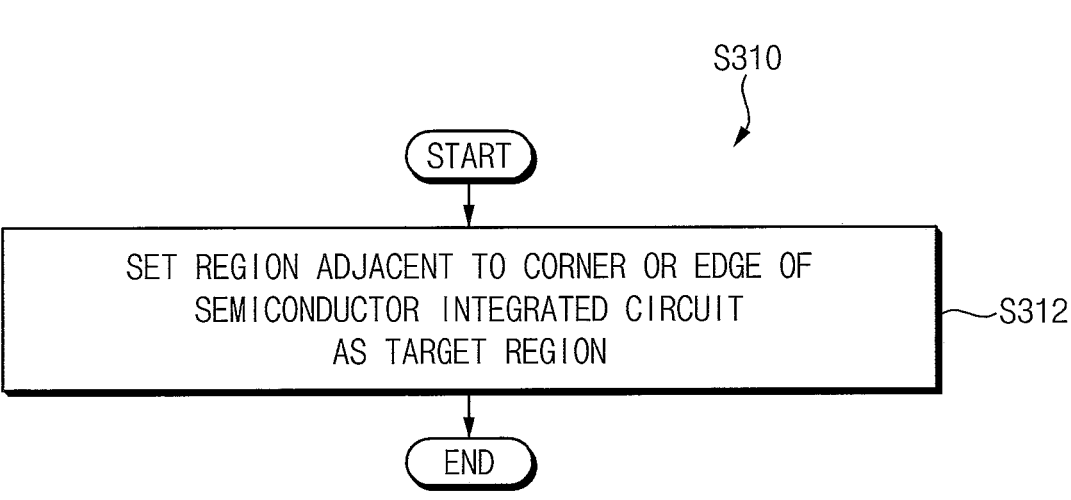
FIG. 9 is a flowchart illustrating an example of setting a target region on a partial region of a semiconductor integrated circuit in FIG. 8, according to an embodiment.
Figure 10:
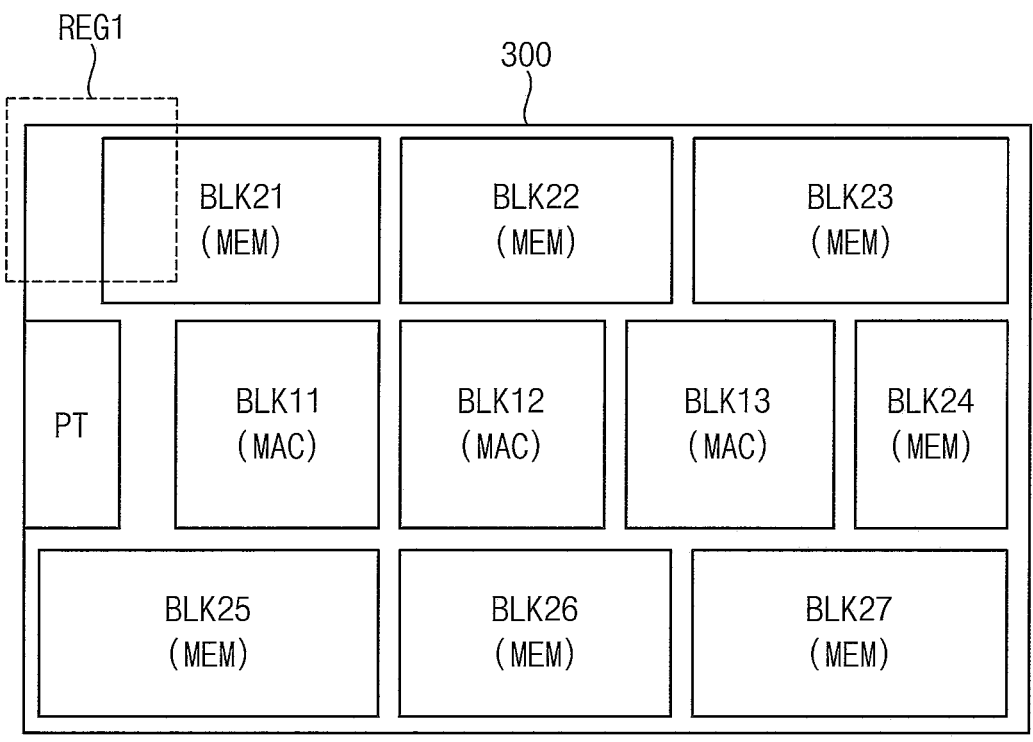
FIG. 10 is a diagram for describing an operation of FIG. 9, according to an embodiment.

FIG. 9 is a flowchart illustrating an example of setting a target region on a partial region of a semiconductor integrated circuit in FIG. 8. FIG. 10 is a diagram for describing an operation of FIG. 9.

Referring to FIGS. 8, 9 and 10, when setting the target region on the partial region of the semiconductor integrated circuit at operation S310, a specific region that is adjacent to a corner or an edge of the semiconductor integrated circuit may be set as the target region at operation S312. In other words, it may be determined based on a location or position of the specific region whether the specific region corresponds to the unused region, the remaining region or the white space.

For example, as illustrated in FIG. 10, an I/O port PT and a plurality of blocks BLK11, BLK12, BLK13, BLK21, BLK22, BLK23, BLK24, BLK25, BLK26 and BLK27 may be arranged or disposed in a semiconductor integrated circuit 300. A first region REG1, which is adjacent to an upper left corner of the semiconductor integrated circuit 300 and is less relevant to the arrangement of the blocks BLK11 to BLK13 and BLK21 to BLK27, may be set as the target region.

In some example embodiments, the plurality of blocks BLK11 to BLK13 and BLK21 to BLK27 may include macro blocks MAC and memory blocks MEM. For example, the blocks BLK11 to BLK13 may be the macro blocks MAC, and the blocks BLK21 to BLK27 may be the memory blocks MEM. For example, the blocks BLK11 to BLK13 that are macro blocks MAC may be arranged adjacent to a center of the semiconductor integrated circuit 300, and the blocks BLK21 to BLK27 that are the memory blocks MEM may be arranged adjacent to a corner and/or an edge of the semiconductor integrated circuit 300 (e.g., arranged to surround the blocks BLK11 to BLK13 that are the macro blocks MAC), because such arrangement is relatively advantageous in terms of the placement and routing. In addition, a relatively large number of wirings may be arranged on the macro blocks MAC, and a relatively small number of wirings may be arranged on the memory blocks MEM. Therefore, the first region REG1 corresponding to at least one of the memory blocks MEM (e.g., corresponding to the block BLK21 that is the memory block MEM) may be set as the target region.

Figure 11:
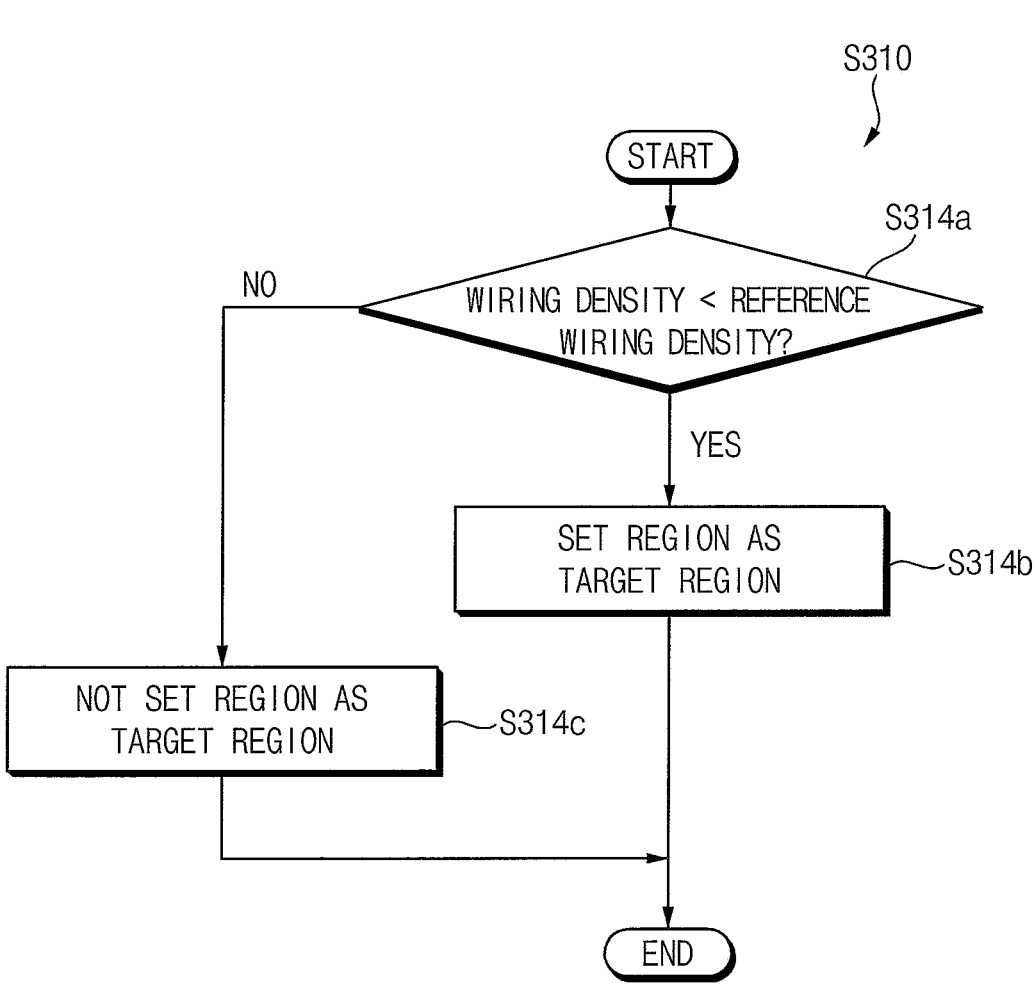
FIG. 11 is a flowchart illustrating another example of setting a target region on a partial region of a semiconductor integrated circuit in FIG. 8, according to an embodiment.
Figure 12A:
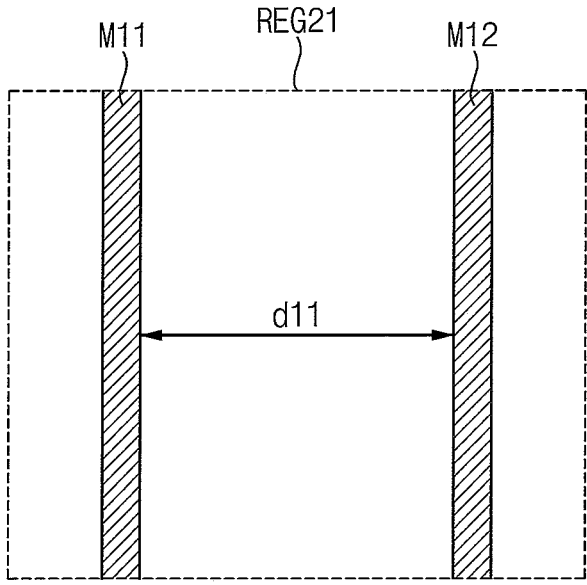
FIGS. 12A and 12B are diagrams for describing an operation of FIG. 11, according to an embodiment.
Figure 12B:
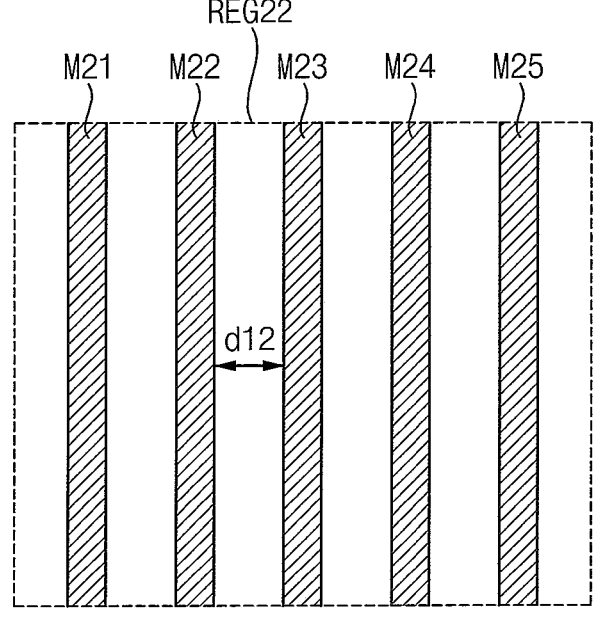

FIG. 11 is a flowchart illustrating another example of setting a target region on a partial region of a semiconductor integrated circuit in FIG. 8. FIGS. 12A and 12B are diagrams for describing an operation of FIG. 11.

Referring to FIGS. 8, 11, 12A and 12B, when setting the target region on the partial region of the semiconductor integrated circuit at operation S310, a wiring density of a specific region included in the semiconductor integrated circuit may be compared with a reference wiring density at operation S314a. When the wiring density of the specific region is less than the reference wiring density (YES at operation S314a), the specific region may be set as the target region at operation S314b. When the wiring density of the specific region is greater than or equal to the reference wiring density (NO at operation S314a), the specific region may not be set as the target region at operation S314c. In other words, it may be determined based on the wiring density of the specific region whether the specific region corresponds to the unused region, the remaining region or the white space.

In some example embodiments, the wiring density of the specific region may be determined based on clock wirings and signal wirings that are included in the specific region (e.g., based on a signal/clock network).

In other example embodiments, the wiring density of the specific region may be determined based on power wirings and ground wirings that are included in the specific region (e.g., based on a power/ground network).

In still other example embodiments, the wiring density of the specific region may be determined based on all of clock wirings, signal wirings, power wirings and ground wirings that are included in the specific region.

For example, as illustrated in FIG. 12A, a second region REG21 included in the semiconductor integrated circuit may include wirings M11 and M12, and may have a relatively small wiring density (e.g., has a wiring density less than the reference wiring density). Thus, the second region REG21 may be set as the target region. In contrast, as illustrated in FIG. 12B, a region REG22 included in the semiconductor integrated circuit may include wirings M21, M22, M23, M24, M25, and may have a relatively large wiring density (e.g., has a wiring density greater than the reference wiring density). The region REG22 of FIG. 12B may have less white space than the second region REG21 of FIG. 12A, and thus the region REG22 may not be set as the target region.

In some example embodiments, the wiring density may be determined or calculated based on the number of wirings included in the specific region. For example, the number of the wirings M11 and M12 included in the second region REG21 of FIG. 12A may be less than a reference number, and the number of wirings M21 to M25 included in region REG22 of FIG. 12B may be greater than or equal to the reference number.

In other example embodiments, the wiring density may be determined or calculated based on a distance or interval between wirings included in the specific region. For example, a distance d11 between the wiring M11 and M12 included in the second region REG21 of FIG. 12A may be longer than a reference distance, and a distance d12 between the wirings M22 and M23 included in the region REG22 of FIG. 12B may be shorter than or equal to the reference distance.

In still other example embodiments, the wiring density may be determined or calculated based on a ratio of an area occupied by the wirings included in the specific region.

Figure 13:
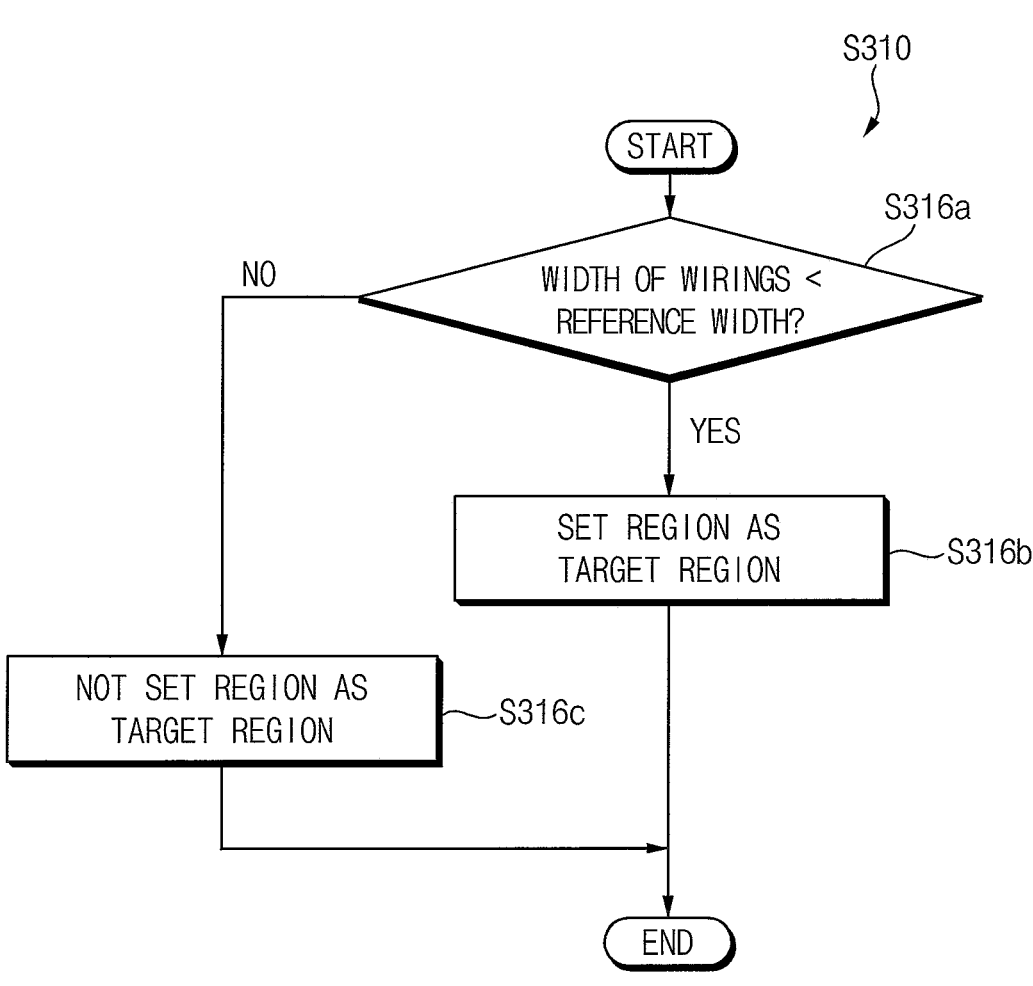
FIG. 13 is a flowchart illustrating still another example of setting a target region on a partial region of a semiconductor integrated circuit in FIG. 8, according to an embodiment.

FIG. 13 is a flowchart illustrating still another example of setting a target region on a partial region of a semiconductor integrated circuit in FIG. 8. FIGS. 14A and 14B are diagrams for describing an operation of FIG. 13.

Referring to FIGS. 8, 13, 14A and 14B, when setting the target region on the partial region of the semiconductor integrated circuit at operation S310, a width of wirings arranged in a specific region included in the semiconductor integrated circuit may be compared with a reference width at operation S316a. When the width of the wirings arranged in the specific region is smaller than the reference width at operation S316a: YES), the specific region may be set as the target region at operation S316b. When the width of the wirings arranged in the specific region is larger than or equal to the reference width (NO at operation S316a), the specific region may not be set as the target region at operation S316c. In other words, it may be determined based on the width of the wirings arranged in the specific region whether the specific region corresponds to the unused region, the remaining region or the white space.

As described above with reference to FIG. 11, the wirings arranged in the specific region may include clock wirings and signal wirings, may include power wirings and ground wirings, and/or may include all of the above-described wirings.

For example, as illustrated in FIG. 14A, a third region REG31 included in the semiconductor integrated circuit may include wirings M31, M32 and M33, and a width w11 of the wiring M32 may be smaller than the reference width. Thus, the third region REG31 may be set as the target region. In contrast, as illustrated in FIG. 14B, a region REG32 included in the semiconductor integrated circuit may include wirings M41, M42 and M43, and a width of wiring M42 may be larger than or equal to the reference width. Although the region REG32 of FIG. 14B and the third region REG31 of FIG. 14A include the same number of wirings, the region REG32 may have less white space than the third region REG31, and thus the region REG32 may not be set as the target region.

Although example embodiments are described with reference to FIGS. 9, 10, 11, 12A, 12B, 13, 14A and 14B that the target region is set based on predetermined conditions or criteria including the location of the specific region, the wiring density of the specific region and the width of the wirings arranged in the specific region, example embodiments are not limited thereto. For example, the unused region, the remaining region or the white space may be determined based on various other conditions or criteria, and may be set as the target region.

In some example embodiments, the target region may be set by combining two or more of the examples of FIGS. 9, 11 and 13. For example, a region that is adjacent to a corner or an edge and has a relatively small wiring density may be set as the target region.

Figure 15:
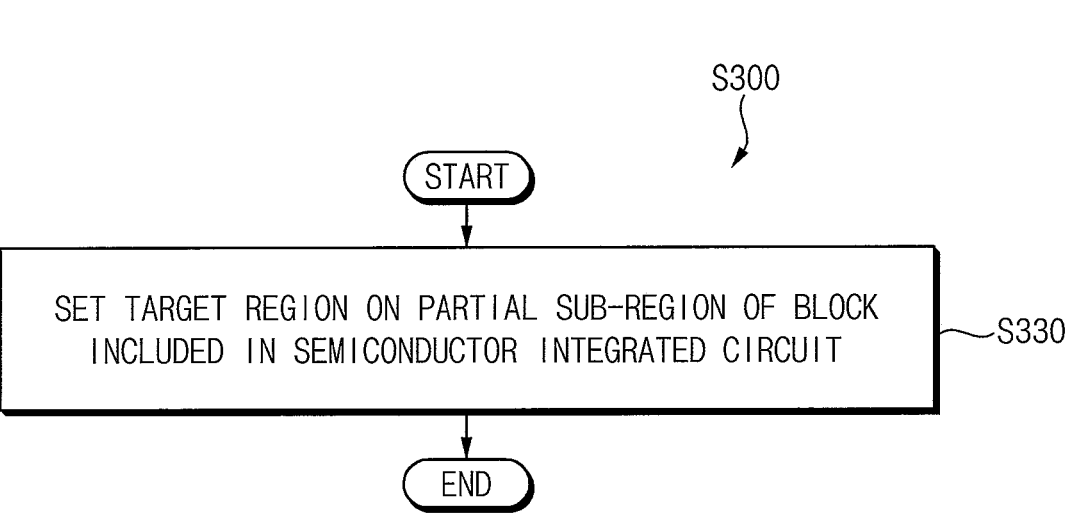
FIG. 15 is a flowchart illustrating another example of setting a target region on a first layout in FIG. 1, according to an embodiment.

FIG. 15 is a flowchart illustrating another example of setting a target region on a first layout in FIG. 1.

Referring to FIGS. 1 and 15, when setting the target region on the first layout at operation S300, the target region may be set on a partial sub-region of at least one block (e.g., a first block) among the plurality of blocks included in the semiconductor integrated circuit at operation S330. For example, an unused region, a remaining region or a white space in the at least one block may be set as the target region.

Figure 16:
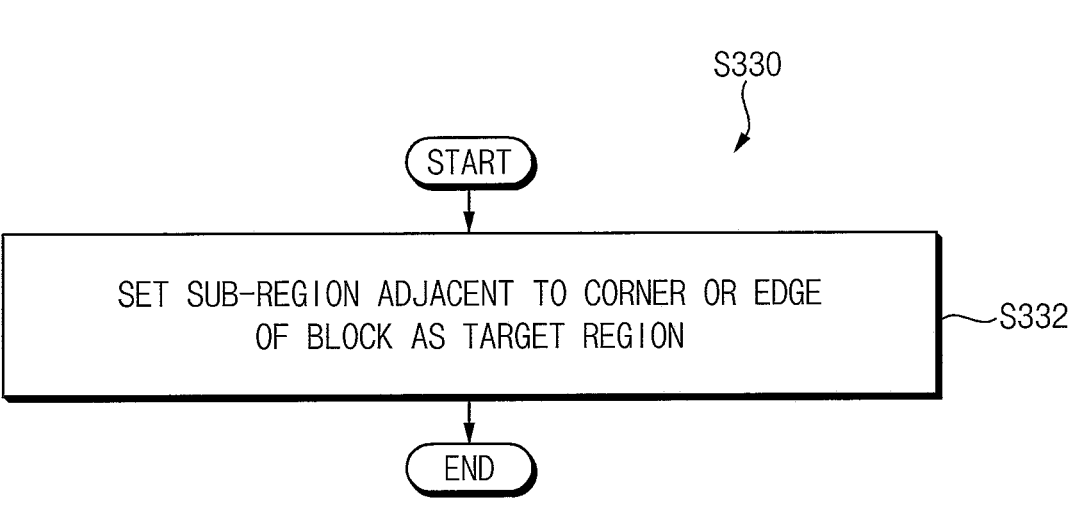
FIG. 16 is a flowchart illustrating an example of setting a target region on a partial sub-region of at least one block in FIG. 15, according to an embodiment.
Figure 17:
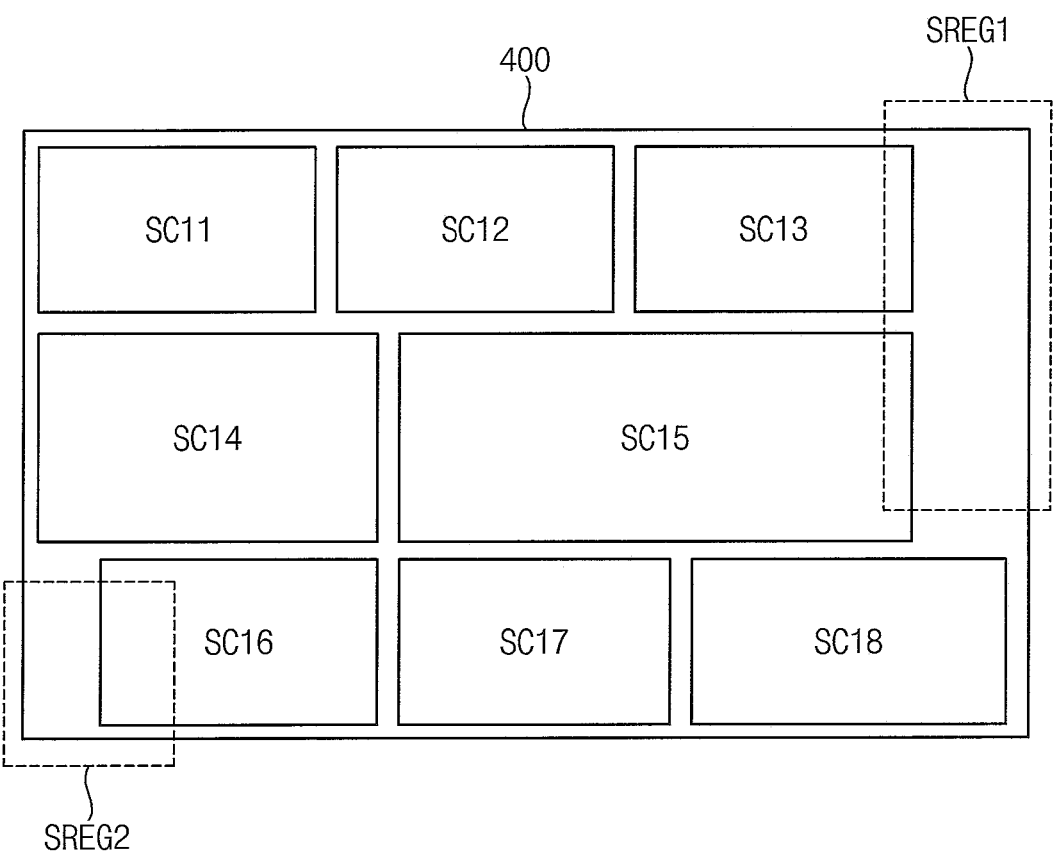
FIG. 17 is a diagram for describing an operation of FIG. 16, according to an embodiment.

FIG. 16 is a flowchart illustrating an example of setting a target region on a partial sub-region of at least one block in FIG. 15. FIG. 17 is a diagram for describing an operation of FIG. 16. The descriptions repeated with FIGS. 9 and 10 will be omitted.

Referring to FIGS. 15, 16 and 17, when setting the target region on the partial sub-region of the at least one block among the plurality of blocks included in the semiconductor integrated circuit at operation S330, a specific sub-region that is adjacent to a corner or an edge of one block included in the semiconductor integrated circuit may be set as the target region at operation S332).

For example, as illustrated in FIG. 17, a plurality of standard cells SC11, SC12, SC13, SC14, SC15, SC16, SC17 and SC18 may be arranged or disposed in a block 400 included in the semiconductor integrated circuit. At least one of a first sub-region SREG1, which is adjacent to an upper right corner and a right edge of the block 400 and is less relevant to the arrangement of the standard cells SC11 to SC18, and a second sub-region SREG2, which is adjacent to a lower left corner of the block 400 and is less relevant to the arrangement of the standard cells SC11 to SC18, may be set as the target region.

Figure 18:
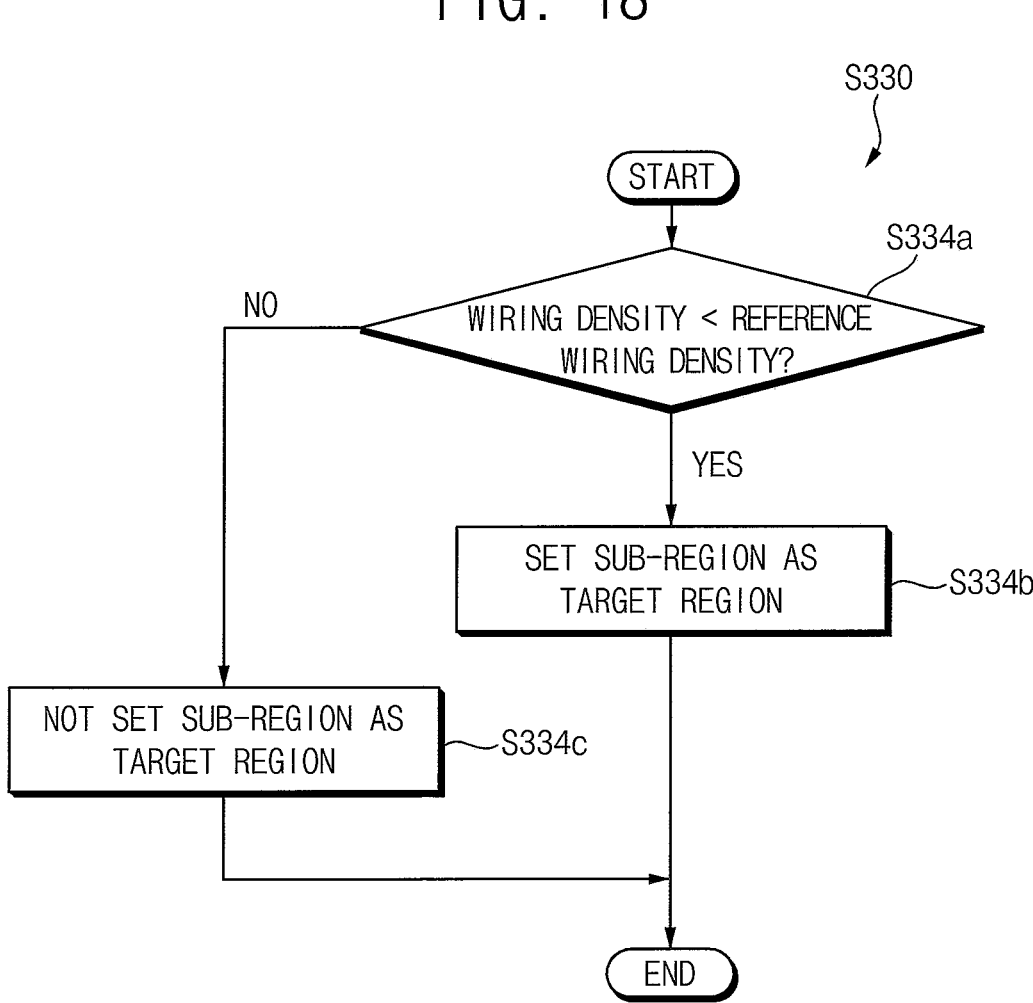
Figure 19:
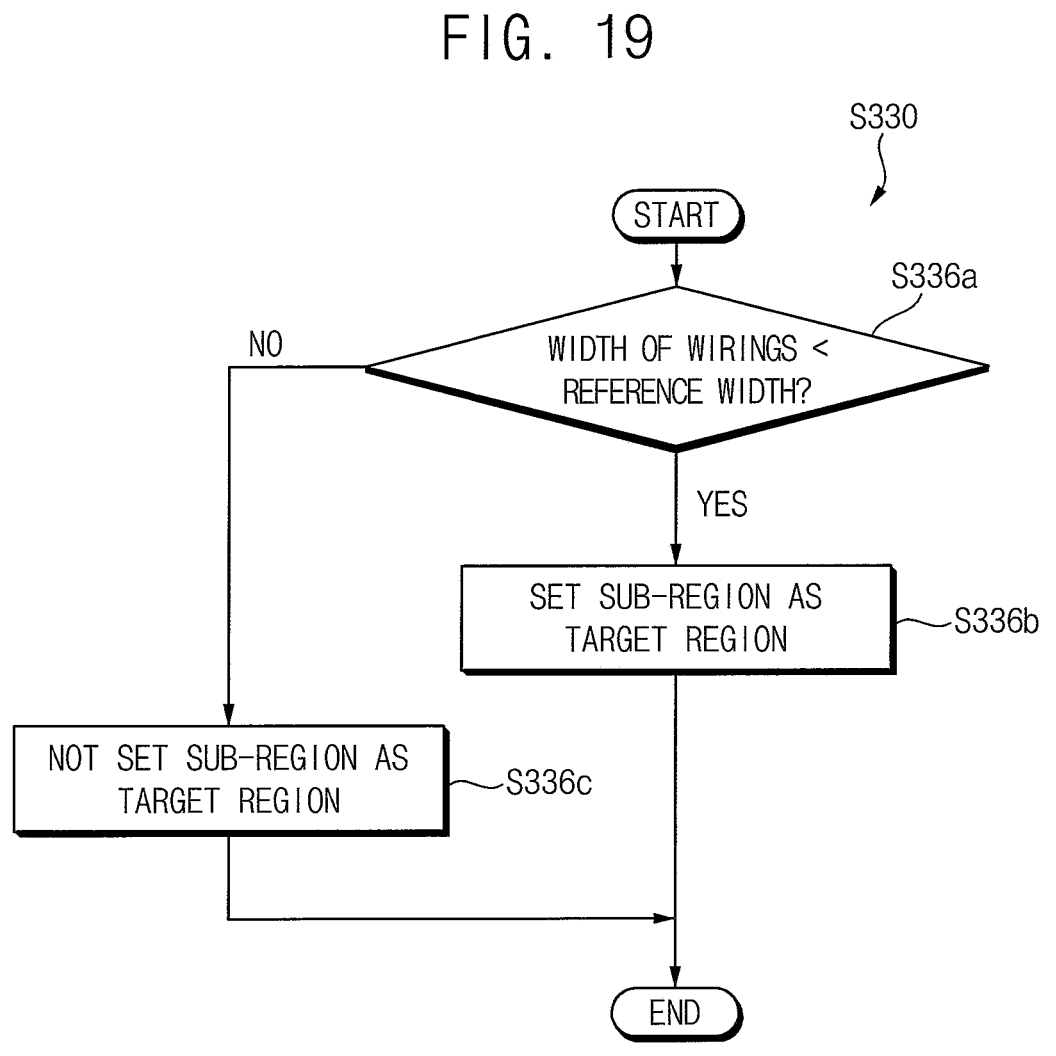

FIGS. 18 and 19 are flowcharts illustrating other examples of setting a target region on a partial sub-region of at least one block in FIG. 15. The descriptions repeated with FIGS. 11 and 13 will be omitted.

Referring to FIGS. 15 and 18, when setting the target region on the partial sub-region of the at least one block among the plurality of blocks included in the semiconductor integrated circuit at operation S330, a wiring density of a specific sub-region included in one block may be compared with a reference wiring density at operation S334a. When the wiring density of the specific sub-region is less than the reference wiring density (YES at operation S334a), the specific sub-region may be set as the target region at operation S334b. When the wiring density of the specific sub-region is greater than or equal to the reference wiring density (NO at operation S334a), the specific sub-region may not be set as the target region at operation S334c.

Referring to FIGS. 15 and 19, when setting the target region on the partial sub-region of the at least one block among the plurality of blocks included in the semiconductor integrated circuit at operation S330, a width of wirings arranged in a specific sub-region included in one block may be compared with a reference width at operation S336a. When the width of the wirings arranged in the specific sub-region is smaller than the reference width (YES at operation S336a), the specific sub-region may be set as the target region at operation S336b. When the width of the wirings arranged in the specific sub-region is larger than or equal to the reference width (NO at operation S336a), the specific sub-region may not be set as the target region at operation S336c.

In some example embodiments, the target region may be set by combining the examples of FIGS. 9, 11 and 13 and the examples of FIGS. 16, 18 and 19. For example, both the specific region included in the semiconductor integrated circuit and the specific sub-region included in the block may be set as the target region.

Figure 20:
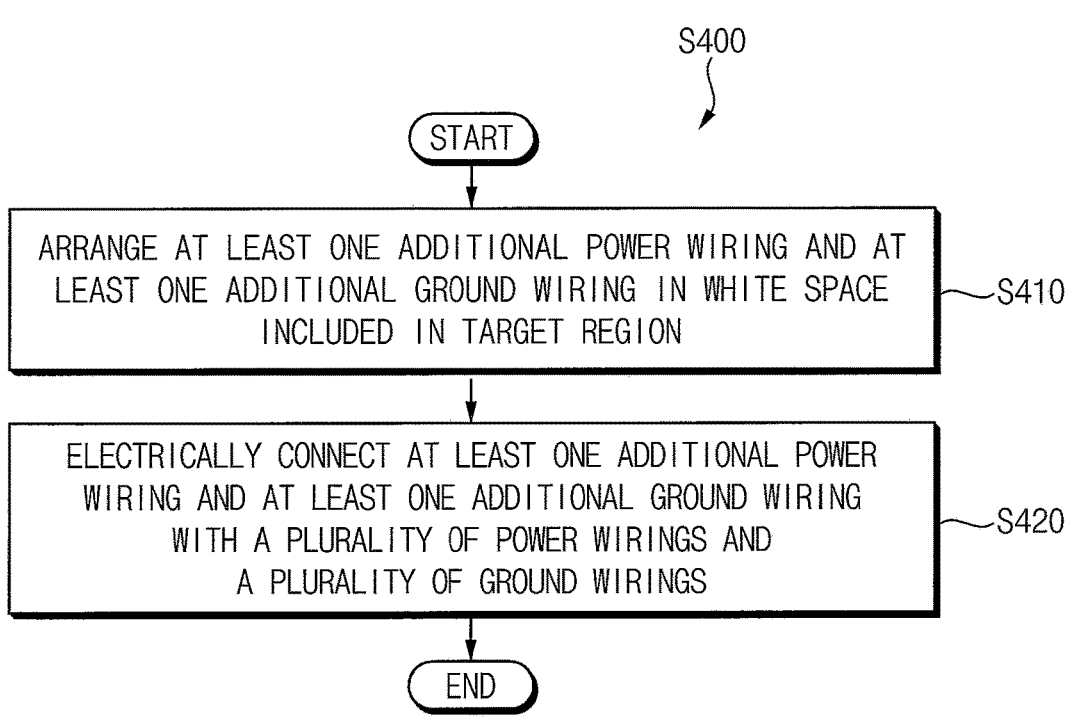
FIG. 20 is a flowchart illustrating an example of obtaining a second layout in FIG. 1, according to an embodiment.

FIG. 20 is a flowchart illustrating an example of obtaining a second layout in FIG. 1. FIGS. 21, 22A, 22B, 23A and 23B are diagrams for describing an operation of FIG. 20.

Referring to FIGS. 1 and 20, when obtaining the second layout of the semiconductor integrated circuit at operation S400, the at least one additional power wiring and the at least one additional ground wiring may be arranged or disposed in a white space included in the target region at operation S410. The at least one additional power wiring and the at least one additional ground wiring may be electrically connected with the plurality of power wirings and the plurality of ground wirings, respectively at operation S420.

Figure 21:
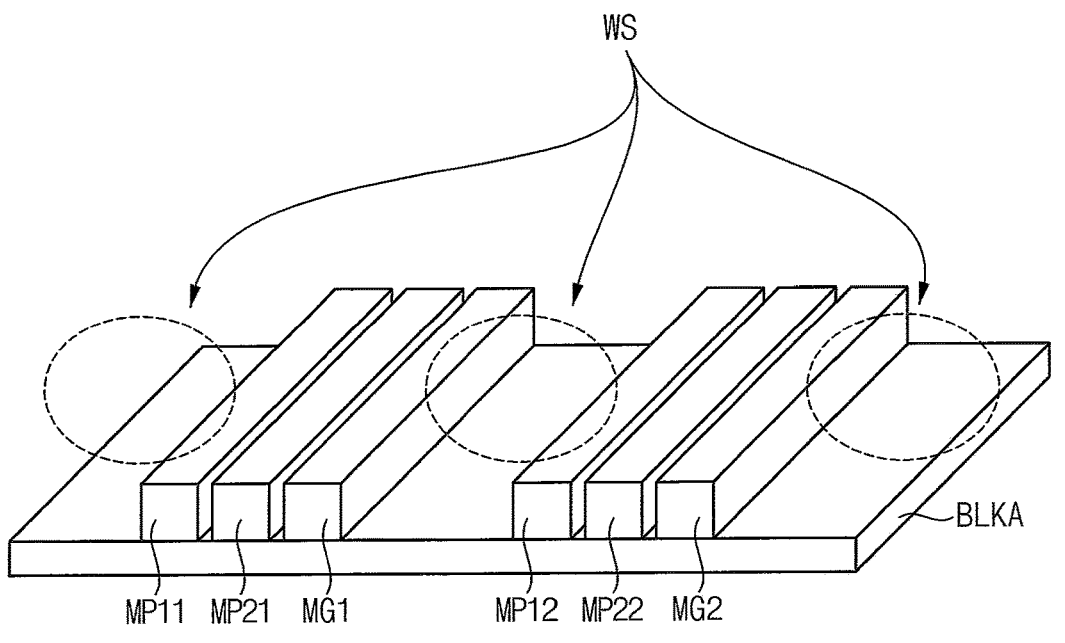
FIGS. 21, 22A, 22B, 23A and 23B are diagrams for describing an operation of FIG. 20, according to an embodiment.

Referring to FIG. 21, in the target region, power wirings MP11, MP12, MP21 and MP22 and ground wirings MG1 and MG2 may be arranged in a wiring layer on a block BLKA, and a white space (or an empty space) WS may exist between the wirings MP11, MP12, MP21, MP22, MG1 and MG2. In addition to a power/ground mesh (e.g., the wirings MP11, MP12, MP21, MP22, MG1 and MG2) that is already formed, an additional power/ground mesh may be further formed, arranged or added in the empty space WS. For example, the power wirings MP11 and MP12 may be wirings for supplying a main power (or a real power), and the power wirings MP21 and MP22 may be wirings for supplying a virtual power. For another example, all of the power wirings MP11, MP12, MP21 and MP22 may be wirings for supplying the main power.

Figure 22A:
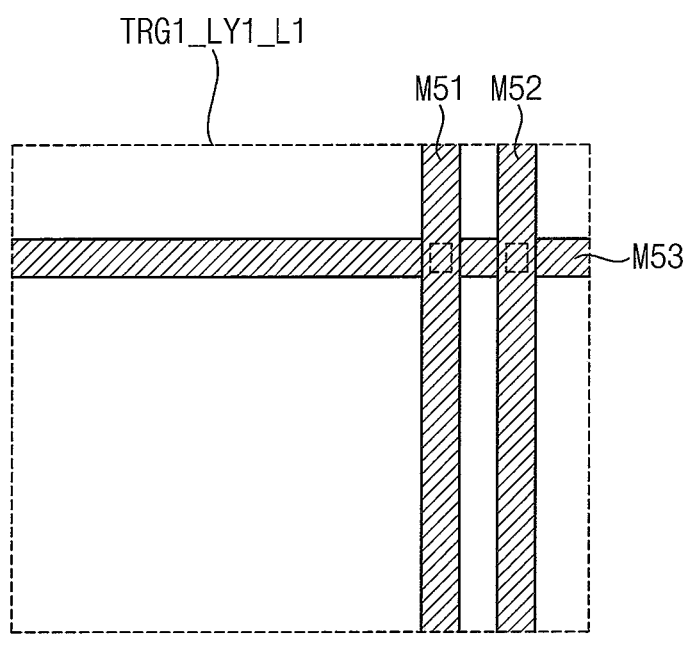

Referring to FIG. 22A, an example of power/ground wirings before operations S300 and S400 are performed, e.g., an example of power/ground wirings arranged in a target region TRG1_LY1_L1 included in the first layout, is illustrated. FIG. 22A illustrates power/ground wirings formed in two adjacent wiring layers (e.g., first and second wiring layers) among a plurality of wiring layers. For example, wirings M51 and M52 may be formed in the first wiring layer, and wiring M53 may be formed in the second wiring layer under the first wiring layer. In FIG. 22A and subsequent figures, dotted lines illustrated at intersections of the wirings M51 to M53 may be vias for electrically connecting the wirings M51 to M53 with each other.

Figure 22B:
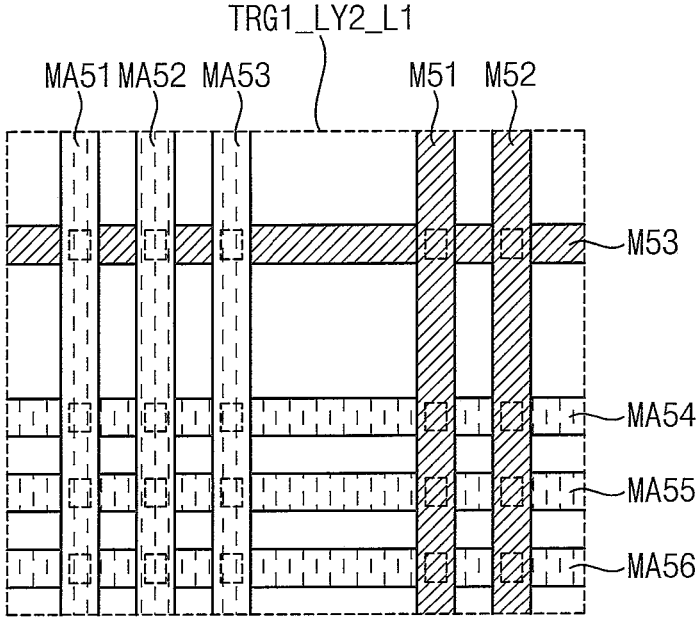

Referring to FIG. 22B, an example of power/ground wirings after operations S300 and S400 are performed, e.g., an example of power/ground wirings arranged in a target region TRG1_LY2_L1 included in the second layout, is illustrated. As with FIG. 22A, FIG. 22B illustrates power/ground wirings formed in two adjacent wiring layers (e.g., the first and second wiring layers) among the plurality of wiring layers. A position on a plane of the target region TRG1_LY2_L1 in the second layout may be substantially the same as a position on a plane of the target region TRG1_LY1_L1 in the first layout. For example, additional wirings MA51, MA52 and MA53 may be formed in the first wiring layer, additional wirings MA54, MA55 and MA56 may be formed in the second wiring layer, and the wirings M51 to M53 and the additional wirings MA51 to MA56 may be electrically connected to each other through vias. Thus, as compared with the first layout, a routing capacitance of the second layout may be increased or reinforced, and an effective resistance of the second layout may be decreased.

Figure 23A:
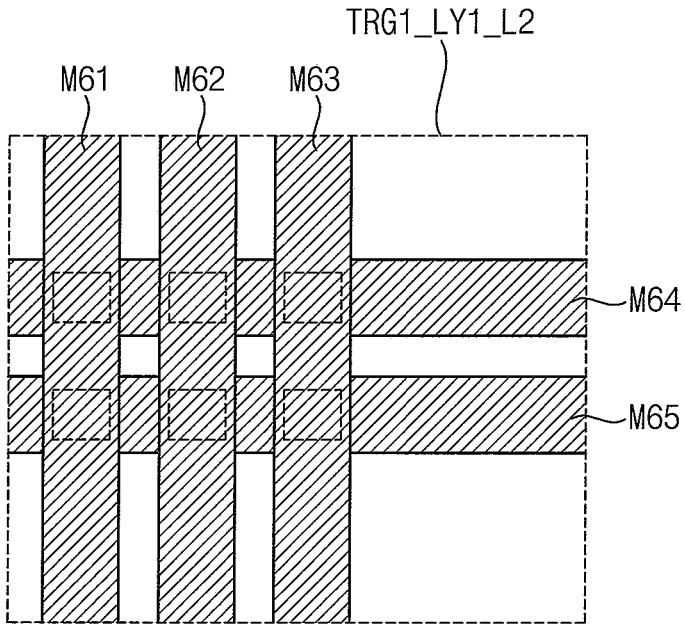
Figure 23B:
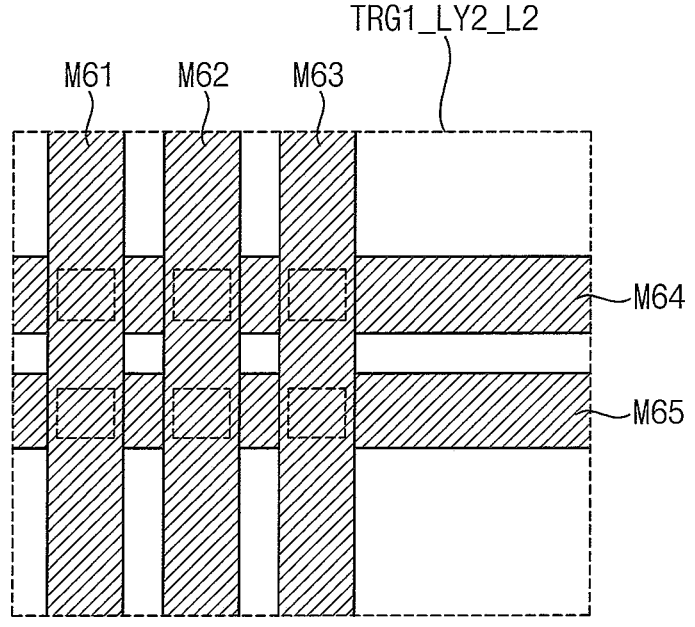

Referring to FIG. 23A, an example of power/ground wirings before operations S300 and S400 are performed, e.g., an example of power/ground wirings arranged in a target region TRG1_LY1_L2 included in the first layout, is illustrated. Referring to FIG. 23B, an example of power/ground wirings after operations S300 and S400 are performed, e.g., an example of power/ground wirings arranged in a target region TRG1_LY2_L2 included in the second layout, is illustrated. FIGS. 23A and 23B illustrate power/ground wirings formed in two adjacent wiring layers (e.g., third and fourth wiring layers) among the plurality of wiring layers, and the third and fourth wiring layers may be different from the first and second wiring layers. In the first and second layouts, positions on a plane of the target regions TRG1_LY1_L2 and TRG1_LY2_L2 may be substantially the same as positions on a plane of the target regions TRG1_LY1_L1 and TRG1_LY2_L1, respectively. For example, wirings M61, M62 and M63 may be formed in the third wiring layer, wirings M64 and M65 may be formed in the fourth wiring layer under the third wiring layer, and additional wirings may not be formed in the third and fourth wiring layers even if operations S300 and S400 are performed.

In other words, as described with reference to FIGS. 3A and 3B, the plurality of wirings (e.g., the plurality of power wirings and the plurality of ground wirings) may be formed in a plurality of wiring layers stacked in a vertical direction. When the at least one additional power wiring and the at least one additional ground wiring are formed according to example embodiments, the additional power wiring and the additional ground wiring may not be formed in all of the plurality of wiring layers. As illustrated in FIGS. 22A and 22B, the additional power wiring and the additional ground wiring may be formed in some wiring layers in which the white space exists. As illustrated in FIGS. 23A and 23B, the additional power wiring and the additional ground wiring may not be formed in other wiring layers in which the white space does not exist, or where insufficient white space exists.

Figure 24:
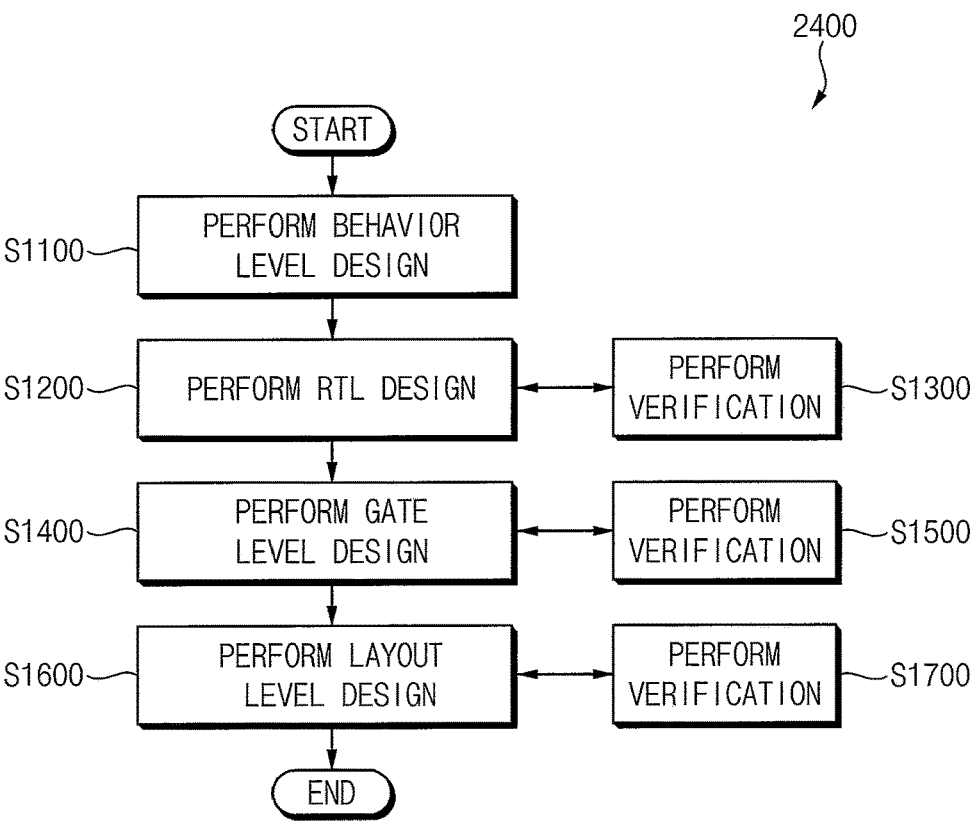
FIG. 24 is a flowchart illustrating a process of designing a semiconductor integrated circuit according to an embodiment.

FIG. 24 is a flowchart illustrating a process of designing a semiconductor integrated circuit according to example embodiments.

Referring to FIG. 24, in a process 2400 of designing a semiconductor integrated circuit according to example embodiments, a behavior level design (or behavior level design process) of the semiconductor integrated circuit, which corresponds to a functional design of the entire semiconductor integrated circuit, is performed first at operation S1100.

The behavior level design may be referred to as an architecture design or a high level design (or high level design process). The high level design may represent that a semiconductor integrated circuit to be designed or as a target device is depicted at an algorithm level and is described in terms of high-level computer language (e.g., C language).

Next, an RTL design (or RTL design process) of the semiconductor integrated circuit is performed at operation S1200, and a verification is performed on the semiconductor integrated circuit on which the RTL design is completed at operation S1300.

Devices and/or circuits designed by the high level design process may be more concretely described by an RTL coding or simulation in operations S1200 and S1300. In addition, codes generated by the RTL coding may be converted into a netlist, and the results may be combined with each other to realize the entire semiconductor integrated circuit. The combined schematic circuit may be verified by a simulation tool. In some example embodiments, an adjusting operation may be further performed in consideration of a result of the verification.

The RTL may be used for representing a coding style used in hardware description languages for effectively ensuring that code models may be synthesized in a certain hardware platform such as an FPGA or an ASIC (e.g., code models may be converted into real logic functions). A plurality of hardware description languages may be used for generating RTL modules. For example, the plurality of hardware description languages may include System Verilog, Verilog, VHDL, or the like.

After that, a gate level design (or gate level design process) of the semiconductor integrated circuit is performed at operation S1400, and a verification is performed on the semiconductor integrated circuit on which the gate level design is completed at operation S1500.

The gate level design may represent that a semiconductor integrated circuit is depicted using basic logic gates, such as AND gates and OR gates, and is described by logical connections and timing information of the logic gates. For example, all signals may be discrete signals and may only have a logical value of zero, one, X and Z (or high-Z).

After that, a layout level design (or layout level design process) of the semiconductor integrated circuit is performed at operation S1600, and a verification is performed on the semiconductor integrated circuit on which the layout level design is completed at operation S1700.

The layout level design may be referred to as a physical design (or physical design process). The layout level design may be performed to implement or realize a logically completed semiconductor integrated circuit on a silicon substrate. For example, the layout level design may be performed based on the schematic circuit prepared in the high level design or the netlist corresponding thereto. The layout level design may include a routing operation of placing and connecting various standard cells that are provided from a cell library, based on a predetermined design rule. For example, the standard cell library SCL 1220 and the design rule DR 1230 in FIG. 4, and the standard cell library SCL 2620 and the design rule DR 2630 in FIG. 5, may be used for the layout level design.

A cell library for the layout level design may contain information on operation, speed, and power consumption of the standard cells. In some example embodiments, the cell library for representing a layout of a circuit having a specific gate level may be defined in a layout design tool. Here, the layout may be prepared to define or describe shapes and sizes of patterns constituting transistors and metal interconnection lines, which will be actually formed on a silicon substrate. For example, layout patterns (e.g., PMOS, NMOS, N-WELL, gate electrodes, and metal interconnection lines thereon) may be suitably disposed to actually form an inverter circuit on a silicon substrate. For this, at least one of inverters defined in the cell library may be selected.

The term "standard cell" may refer to a unit of an integrated circuit in which a size of the layout meets a preset rule or criterion. The standard cell may include an input pin and an output pin and may process a signal received through the input pin to output a signal through the output pin. For example, the standard cell may include a basic cell such as an AND logic gate, an OR logic gate, a NOR logic gate, or an inverter, a complex cell such as an OR/AND/INVERTER (OAI) or an AND/OR/INVERTER (AOI), and a storage element such as a master-slave flip flop or a latch.

In addition, the routing operation may be performed on selected and disposed standard cells. In detail, the routing operation may be performed on the selected and disposed standard cells to connect them to upper interconnection lines. By the routing operation, the standard cells may be electrically connected to each other to meet a design.

Layout design schemes may be classified into a full custom type for manually performing a work according to a work type using a layout editor, an auto placement and routing (P&R) type using an auto P&R tool, and a semi-custom type using all of the above-described types.

In operation S1700, a verification operation may be performed on the layout to check whether there is a portion violating the given design rule, after the routing operation.

In some example embodiments, the verification operation may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate level netlist.

When operations S1600 and S1700 are performed, the processes of designing the layout of the semiconductor integrated circuit according to example embodiments described with reference to FIGS. 1 through 23 may be used, applied or employed.

Figure 25:
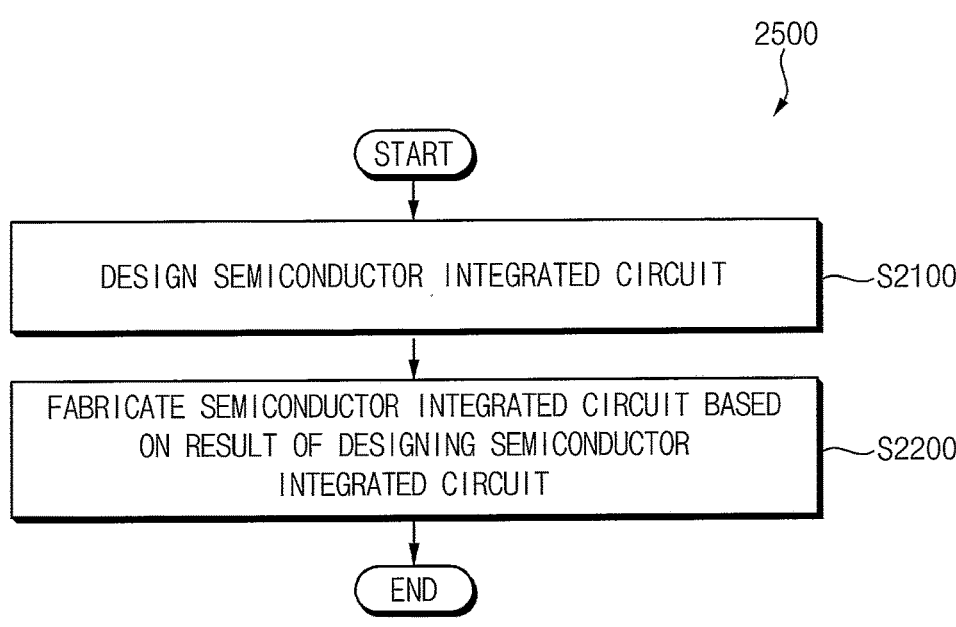
FIG. 25 is a flowchart illustrating a process of manufacturing a semiconductor integrated circuit according to an embodiment.

FIG. 25 is a flowchart illustrating a process of manufacturing a semiconductor integrated circuit according to example embodiments.

Referring to FIG. 25, in a process 2500 of manufacturing a semiconductor integrated circuit according to example embodiments, the semiconductor integrated circuit is designed at operation S2100, and the semiconductor integrated circuit is fabricated based on a result of designing the semiconductor integrated circuit at operation S2200. Operation S2100 may be performed based on the process 2400 of designing the semiconductor integrated circuit according to example embodiments described with reference to FIG. 24.

In operation S2200, the semiconductor integrated circuit may be fabricated or manufactured by a mask, a wafer, a test, an assembly, packaging, and the like. For example, a corrected layout may be generated by performing optical proximity correction on the design layout, and a photo mask may be fabricated or manufactured based on the corrected layout. For example, various types of exposure and etching processes may be repeatedly performed using the photo mask, and patterns corresponding to the layout design may be sequentially formed on a substrate through these processes. Thereafter, the semiconductor integrated circuit may be obtained in the form of a semiconductor chip through various additional processes.

As will be appreciated by those skilled in the art, embodiments may include a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Embodiments may be applied to design various electronic devices and systems that include the semiconductor integrated circuits and the semiconductor devices. For example, embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of designing a layout of a semiconductor integrated circuit, the method comprising:
   receiving input data defining the semiconductor integrated circuit;
   determining a first layout of the semiconductor integrated circuit by performing a placement and routing (P&R) procedure based on the input data, wherein the first layout includes a plurality of blocks, a plurality of standard cells, a plurality of power wirings, a plurality of ground wirings, a plurality of clock wirings, and a plurality of signal wirings;
   selecting a target region included in the first layout, wherein the target region is capable of accommodating at least one new power wiring that is not included in the first layout, and at least one new ground wiring that is not included in the first layout; and
   determining a second layout of the semiconductor integrated circuit by adding the at least one new power wiring and the at least one new ground wiring to the target region in the first layout,
   wherein the target region is selected based on a comparison between a reference value and at least one of a wiring density of the target region and a width of wirings included in the target region.

2. The method of claim 1, wherein the selecting of the target region of the first layout includes:
   selecting a partial region of the semiconductor integrated circuit to be included in the target region.

3. The method of claim 2, wherein the selecting of the partial region of the semiconductor integrated circuit includes:
   selecting a first region included in the semiconductor integrated circuit as the target region, the first region being adjacent to a corner or an edge of the semiconductor integrated circuit.

4. The method of claim 3, wherein the plurality of blocks includes macro blocks and memory blocks,
   wherein the macro blocks are arranged adjacent to a center of the semiconductor integrated circuit,
   wherein the memory blocks are arranged adjacent to the corner or the edge of the semiconductor integrated circuit, and
   wherein the first region corresponds to at least one of the memory blocks.

5. The method of claim 2, wherein the selecting of the partial region of the semiconductor integrated circuit includes:

based on a wiring density of a first region included in the semiconductor integrated circuit being less than a reference wiring density, selecting the first region as the target region.

6. The method of claim 5, wherein the first region includes at least one clock wiring of the plurality of clock wirings and at least one signal wiring of the plurality of signal wirings, and wherein the wiring density of the first region is determined based on the at least one clock wiring and the at least one signal wiring.

7. The method of claim 5, wherein the first region includes at least one power wiring of the plurality of power wirings and at least one ground wiring of the plurality of ground wirings, and wherein the wiring density of the first region is determined based on the at least one power wiring and the at least one ground wiring.

8. The method of claim 2, wherein the selecting of the partial region includes:

based on a width of wirings arranged in a first region included in the semiconductor integrated circuit being smaller than a reference width, selecting the first region as the target region.

9. The method of claim 1, wherein the selecting of the target region includes:

selecting a partial sub-region of a first block among the plurality of blocks included in the semiconductor integrated circuit to be included in the target region.

10. The method of claim 9, wherein the selecting of the partial sub-region includes:

selecting a first sub-region included in the first block as the target region, the first sub-region being adjacent to a corner or an edge of the first block.

11. The method of claim 9, wherein the selecting of the partial sub-region includes:

based on a wiring density of a first sub-region included in the first block being less than a reference wiring density, selecting the first sub-region as the target region.

12. The method of claim 9, wherein the selecting of the partial sub-region includes:

based on a width of wirings arranged in a first sub-region included in the first block being smaller than a reference width, selecting the first sub-region as the target region.

13. The method of claim 1, wherein the determining of the second layout includes:

arranging the at least one new power wiring and the at least one new ground wiring in a white space included in the target region; and electrically connecting the at least one new power wiring with the plurality of power wirings, and the at least one new ground wiring with the plurality of ground wirings.

14. The method of claim 13, wherein the plurality of power wirings and the plurality of ground wirings are formed in a plurality of wiring layers which are stacked in a vertical direction, and wherein the at least one new power wiring and the at least one new ground wiring are formed in a first wiring layer among the plurality of wiring layers.

15. The method of claim 14, wherein the at least one new power wiring and the at least one new ground wiring are not formed in a second wiring layer among the plurality of wiring layers.

16. The method of claim 1, wherein the determining of the first layout includes:

determining a floor plan for the plurality of blocks and the plurality of standard cells;

determining a power plan for the plurality of power wirings and the plurality of ground wirings;

determining a placement of elements that are included in the plurality of blocks and the plurality of standard cells;

performing a clock tree synthesis (CTS) of clock signals that are provided to the elements based on the plurality of clock wirings; and performing a routing of general signals that are provided to the elements based on the plurality of signal wirings.

17. The method of claim 16, further comprising verifying a result of the placement and the routing, wherein the selecting of the target region of the first layout and the determining of the second layout are performed while the verifying is performed.

18. The method of claim 1, wherein the semiconductor integrated circuit comprises a system-on-chip (SoC).

19. A design system for a semiconductor integrated circuit, the design system comprising:

a storage device configured to store information including instructions; and a processor configured to access the storage device and to execute the instructions to implement a design module configured to:

receive input data defining the semiconductor integrated circuit;

determine a first layout of the semiconductor integrated circuit by performing a placement and routing (P&R) process based on the input data, wherein the first layout includes a plurality of blocks, a plurality of standard cells, a plurality of power wirings, a plurality of ground wirings, a plurality of clock wirings, and a plurality of signal wirings;

select a target region included in the first layout, wherein the target region is suitable for arranging at least one new power wiring that is not included in the first layout, and at least one new ground wiring that is not included in the first layout; and determine a second layout of the semiconductor integrated circuit by the at least one new power wiring and the at least one new ground wiring to the target region in the first layout, wherein the target region is selected based on a comparison between a reference value and at least one of a wiring density of the target region and a width of wirings included in the target region.

20. A method of designing a layout of a semiconductor integrated circuit, the method comprising:

receiving input data defining the semiconductor integrated circuit;

determining a first layout of the semiconductor integrated circuit by performing a placement and routing (P&R) procedure based on the input data, wherein obtaining the first layout includes:

performing a floor plan of a plurality of blocks and a plurality of standard cells that are included in the semiconductor integrated circuit;

performing a power plan of a plurality of power wirings and a plurality of ground wirings that are included in the semiconductor integrated circuit;

performing a placement of elements that are included in the plurality of blocks and the plurality of standard cells;

performing a clock tree synthesis (CTS) of clock signals that are provided to the elements via a plurality of clock wirings included in the semiconductor integrated circuit; and performing a routing of general signals that are provided to the elements via a plurality of signal wirings included in the semiconductor integrated circuit;

verifying a result of the placement and the routing;

while the verifying is performed, selecting a target region included in the first layout, wherein the target region is capable of accommodating at least one new power wiring that is not included in the first layout, and at least one new ground wiring that is not included in the first layout; and determining a second layout of the semiconductor integrated circuit by adding the at least one new power wiring and the at least one new ground wiring to the target region in the first layout, wherein the target region includes at least one of a first region included in the semiconductor integrated circuit and a first sub-region included in a first block from among the plurality of blocks included in the semiconductor integrated circuit, the first region being adjacent to a corner or an edge of the semiconductor integrated circuit, and the first sub-region being adjacent to a corner or an edge of the first block, wherein the plurality of power wirings and the plurality of ground wirings are formed in a plurality of wiring layers which are stacked in a vertical direction, wherein the at least one new power wiring and the at least one new ground wiring are formed in a first wiring layer among the plurality of wiring layers, and wherein the at least one new power wiring and the at least one new ground wiring are not formed in a second wiring layer among the plurality of wiring layers.

* * * * *